United States Patent [19]
Hanibuchi

[11] Patent Number: 5,485,026
[45] Date of Patent: Jan. 16, 1996

[54] SEMICONDUCTOR INTEGRATED CIRCUIT DEVICE HAVING IMPROVED INTEGRATION AND DESIGN FLEXIBILITY

[75] Inventor: Toshiaki Hanibuchi, Itami, Japan

[73] Assignee: Mitsubishi Denki Kabushiki Kaisha, Tokyo, Japan

[21] Appl. No.: 418,158

[22] Filed: Apr. 6, 1995

Related U.S. Application Data

[63] Continuation of Ser. No. 227,391, Apr. 14, 1994, abandoned.

[30] Foreign Application Priority Data

May 17, 1993 [JP] Japan .................................. 5-114796

[51] Int. Cl.$^6$ .................................................. H01L 27/10
[52] U.S. Cl. ........................... 257/203; 257/205; 257/207
[58] Field of Search ................................... 257/203, 205, 257/207

[56] References Cited

U.S. PATENT DOCUMENTS

| | | | |
|---|---|---|---|
| 4,825,107 | 4/1989 | Naganuma et al. | 257/203 |
| 4,942,317 | 7/1990 | Tanaka et al. | 257/203 |
| 5,083,181 | 1/1992 | Yoshida et al. | 257/203 |
| 5,162,893 | 11/1992 | Okano | 257/203 |
| 5,300,798 | 4/1994 | Yamazaki et al. | 257/207 |

FOREIGN PATENT DOCUMENTS

| | | |
|---|---|---|
| 61-25324 | 2/1986 | Japan . |
| 63-196060 | 8/1988 | Japan .................................. 257/203 |
| 63-191636 | 12/1988 | Japan . |
| 3-120743 | 5/1991 | Japan .................................. 257/207 |
| 4-53266 | 2/1992 | Japan .................................. 257/203 |

*Primary Examiner*—Ngân V. Ngô
*Attorney, Agent, or Firm*—Oblon, Spivak, McClelland, Maier & Neustadt

[57] ABSTRACT

Inter-circuit interference such as a switching noise is suppressed without deteriorating the circuit integration. An output buffer (1) is connected to power source lines (11) and (21) by though holes. In a similar manner, an output buffer (2) is connected to power source lines (11) and (21) and an output buffer (3) is connected to power source lines (22) and (12). The power source lines (21) and (22) are disposed on the same straight line and terminate in an area which is sandwiched by the output buffers (2) and (3). The power source lines (11) and (12) are disposed on the same straight line and terminate in an area which is sandwiched by the output buffers (2) and (3). The power source line for supplying electric power to the output buffers (1) and (2) and the power source line for supplying electric power to the output buffer (3) are separated from each other, and therefore, inter-circuit interference such as a switching noise will not be created between the output buffers (1), (2) and the output buffer (3).

11 Claims, 24 Drawing Sheets

SEMICONDUCTOR INTEGRATED CIRCUIT DEVICE HAVING IMPROVED INTEGRATION AND DESIGN FLEXIBILITY

This application is a continuation of application Ser. No. 08/227,391, filed on Apr. 14, 1994, now abandoned.

BACKGROUND OF THE INVENTION

1. Field of the Invention

The present invention relates to a semiconductor integrated circuit device which is fabricated in a highly dense layout while preventing interference between circuits which are formed therein.

2. Description of the Prior Art

FIG. 19 is a view showing a structure of an ordinary semiconductor integrated circuit device in which a logic circuit 200 is disposed between an input buffer part 300 and an output buffer part 100. A signal supplied to the semiconductor integrated circuit device is admitted to the input buffer part 300, processed at the logic circuit 200 and outputted from the output buffer part 100 to a point outside the semiconductor integrated circuit device.

FIG. 20 is a circuitry diagram showing an example of a structure of the output buffer part 100. The output buffer part 100 includes output buffers 1, 2 and 3 which have input terminals 111, 112 and 113, and output terminals 121, 122 and 123, respectively. All of the output buffers 1, 2 and 3 are connected to a power source line 11 which supplies a potential VCC and to a power source line 21 which supplies a ground potential GND.

FIG. 21 is a circuitry diagram showing another example of a structure of the output buffer part 100. The illustrated output buffer part 100 includes output buffers 1, 2 and 4. The output buffer 4 has an input terminal 114 and an output terminal 124. All of the output buffers 1, 2 and 4 are connected to the power source line 11 which supplies the potential VCC and to power source line 21 which supplies ground potential GND. Further, the output buffer 4 is connected to a power source line 31 which supplies a potential VEE.

In recent years, as the semiconductor integrated circuit device has become faster and the driving capabilities of the output buffers 1 to 4 increase, a switching noise generated by the output buffers 1 to 4 becomes more detrimental to the circuit portion around the output buffers. In other words, when transferred to tile semiconductor integrated circuit device through the power source lines 11, 21 and 31, the switching noise could cause malfunction of the semiconductor integrated circuit device.

To eliminate the influence of the switching noise which is generated by the output buffers 1 to 4, the power source line which is connected to the output buffer part 100 is customarily separated from the power source lines which are connected to the logic circuit part 200 and the input buffer part 300. In addition, separation of the power source lines from each other is also necessary within the output buffer part 100 if a small amplitude interface needs be provided with the buffers or if both the TTL level and the ECL level are to be taken into account.

An instance of this is illustrated in FIG. 22 which diagrammatically shows that the power source lines are separated from each other within the output buffer part 100 which includes output buffers 1, 2 and 3 which have the same structure as those shown in FIG. 20. While the potentials VCC and GND are supplied to both output buffers 1 and 2 through the power source lines 11 and 12, respectively, power sources 12 and 22 are used to provide the output buffer 3 with the potentials VCC and GND. Thus, between the output buffers 1 and 2 and the output buffer 3, the power source lines are separated from each other.

FIG. 23 is a circuitry diagram showing where the power source lines are separated from each other within the output buffer part 100 which includes output buffers 1, 2 and 4 which have the same structure as those shown in FIG. 21. The output buffers 1 and 2 are both TTL type buffers which output a relatively large amplitude. The potentials VCC and GND are supplied to these output buffers 1 and 2 through the power source lines 11 and 21, respectively. On the other hand, the output buffer 4 is an ECL type buffer which outputs a relatively small amplitude. While the potential VCC is supplied to the output buffer 4 through the power source line 11, which is the same with the output buffers 1 and 2, the potential GND is supplied to the output buffer 4 through the power source line 22. By thus isolating the power source line which provides the potential GND, a switching noise from the output buffers 1 and 2 which are each constructed as a TFL type buffer which outputs a relatively large amplitude is denied entry into the output buffer 4 which is structured as an ECL type buffer which outputs a relatively small amplitude.

FIG. 24 is a plan view showing wiring on the semiconductor in which the power source lines are separated from each other in the manner described above. FIG. 24 corresponds to the circuitry diagram of FIG. 22. The output buffer part 100 is formed in an area 101 and the power source lines 11, 12, 21 and 22 are disposed above the output buffer part 100. Thus, all power source lines which could be connected to the output buffers are formed in the area in which the output buffers are disposed so that the output buffers can be selectively connected to the power source lines. This arrangement is present in most semiconductor integrated circuit devices, and particularly, in most master-slice type semiconductor integrated circuits.

Having such a structure as above, the conventional semiconductor integrated circuit device requires that the buffer area be wide enough so that all the power source lines which could be connected to the buffers can be disposed in the buffer area. Hence, the power source lines 12 and 22 which will not be connected to the output buffer 1 are inevitably disposed above the output buffer 1, thereby unnecessarily increasing the width of the area which is demanded by the output buffer 1. This deteriorates the integration of the semiconductor integrated circuit device.

The deterioration in the integration is not only present in the output buffer area and the integration is deteriorated in an inner logic block as well. This is further disadvantageous if both a TTL circuit and an ECL circuit are to be formed in the inner logic block or if both a digital circuit and an analog circuit are to be formed in the inner logic block. In such a case, since the arrangement of the power source lines must be calculated early in the designing stage and a later change in the arrangement is not easily made, the designing freedom is low.

In other situations, due to a lengthy wiring from the power source lines or pads to the buffers, a resistance or inductance component could adversely affect the semiconductor integrated circuit device.

SUMMARY OF THE INVENTION

A semiconductor integrated circuit device according to a first aspect of the present invention comprises: (a) a plurality of semiconductor regions which are arranged in a semiconductor substrate; (b) at least one semiconductor integrated circuit which is formed in a first direction in each of the semiconductor regions, the semiconductor integrated circuit receiving at least one common potential; and (c) at least one power source line which is disposed above the semiconductor integrated circuit, the power source line having an end at a boundary between adjacent two semiconductor regions of the semiconductor regions, the power source line extending in the first direction.

In a second aspect of the present invention, the semiconductor integrated circuit includes: (b-1) a plurality of logic blocks for performing a predetermined process on information which is given to the semiconductor integrated circuit; and (b-2) an input/output circuit for inputting the information to the logic blocks and for outputting processed information which underwent the predetermined process. The power source line is formed in the input/output circuit.

Further, the input/output circuit preferably includes a plurality of different types of buffers which receive signals having different amplitudes.

Further, the different types of buffers preferably include an ECL type buffer and a TTL type buffer.

In a third aspect of the present invention, the semiconductor integrated circuit includes (b-3) a plurality of different types of logic blocks which output signals having different amplitudes, and the power source line is formed in the logic blocks.

Further, the different types of logic blocks may be formed by cells which have the same structure.

In a fourth aspect of the present invention, the semiconductor integrated circuit includes: (b-4) a first logic block for processing a digital signal; and (b-5) a second logic block for processing an analog signal. The power source line is formed in the first and the second logic blocks.

Further, the first and the second logic blocks are formed by cells which have the same structure.

In a fifth aspect of the present invention, the semiconductor integrated circuit includes: (b-6) a first logic block of the TTL type; and (b-7) a second logic block of the ECL type. The power source line is formed in the first and second logic blocks.

Further, the first and the second logic blocks are formed by cells which have the same structure.

The semiconductor regions may be arranged in a second direction which is perpendicular to the first direction.

Thus, in the present invention, since the power source lines are arranged on the same straight line without being connected to each other, the semiconductor circuit does not require a large width.

The power source lines terminate at the boundary region between adjacent areas to which different potentials are supplied. Hence, inter-circuit interference such as a switching noise is suppressed without deteriorating the integration.

Accordingly, it is an object of the present invention to provide a semiconductor integrated circuit device which suppresses interference between circuits thereof such as a switching noise without degrading the integration of the semiconductor integrated circuit device.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
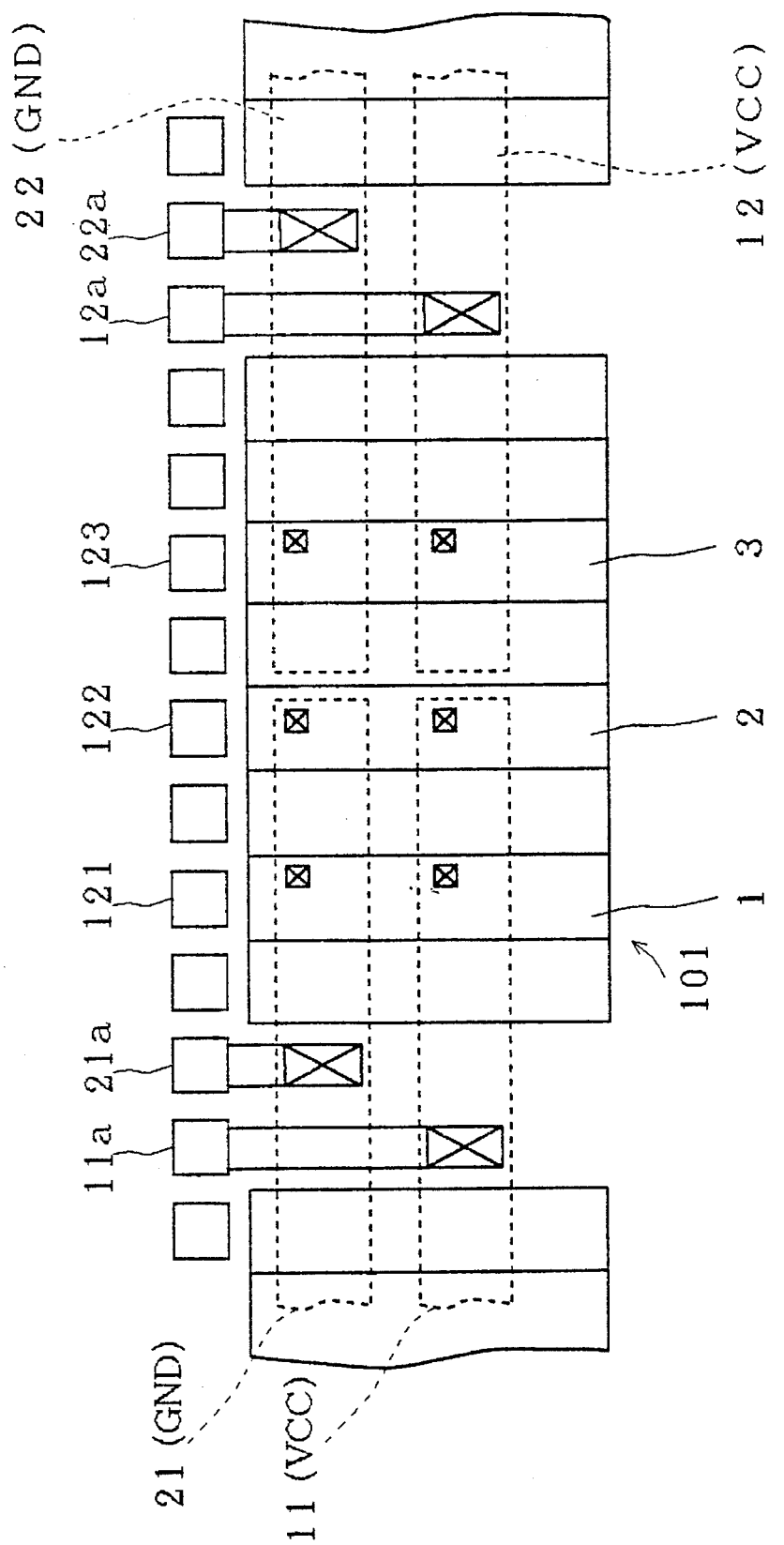
FIG. 1 is a plan view showing a first preferred embodiment of the present invention.

A. Preferred Embodiment Applied to an Output Buffer
(A-1) First Preferred Embodiment:

FIG. 1 is a plan view showing the structure of a first preferred embodiment of the present invention. Output buffers 1, 2 and 3 are formed in an area 101. Power source lines 11, 12, 21 and 22 are connected to power source pads 11a, 12a, 21a and 22a, respectively, by via holes which are each shown in FIG. 1 as the cross marks enclosed by rectangles. Potentials VCC, VCC, GND and GND are supplied to the power source pads 11a, 12a, 21a and 22a, respectively. The output buffer 1 is connected to the power source lines 11 and 21 by through holes. Although not illustrated in detail for simplicity of illustration, the output buffer 1 is also connected to a pad 121 which serves as an output terminal. In a similar manner, the output buffer 2 is connected to the power source lines 11 and 21 and to a pad 122, while the output buffer 3 is connected to the power source lines 22 and 12 and to a pad 123.

The power source lines 21 and 22 extend on along a common straight line and terminate in an area which is sandwiched by the output buffers 2 and 3. The power source lines 11 and 12 extend on the same straight line and terminate in an area which is sandwiched by the output buffers 2 and 3.

Figure 22:
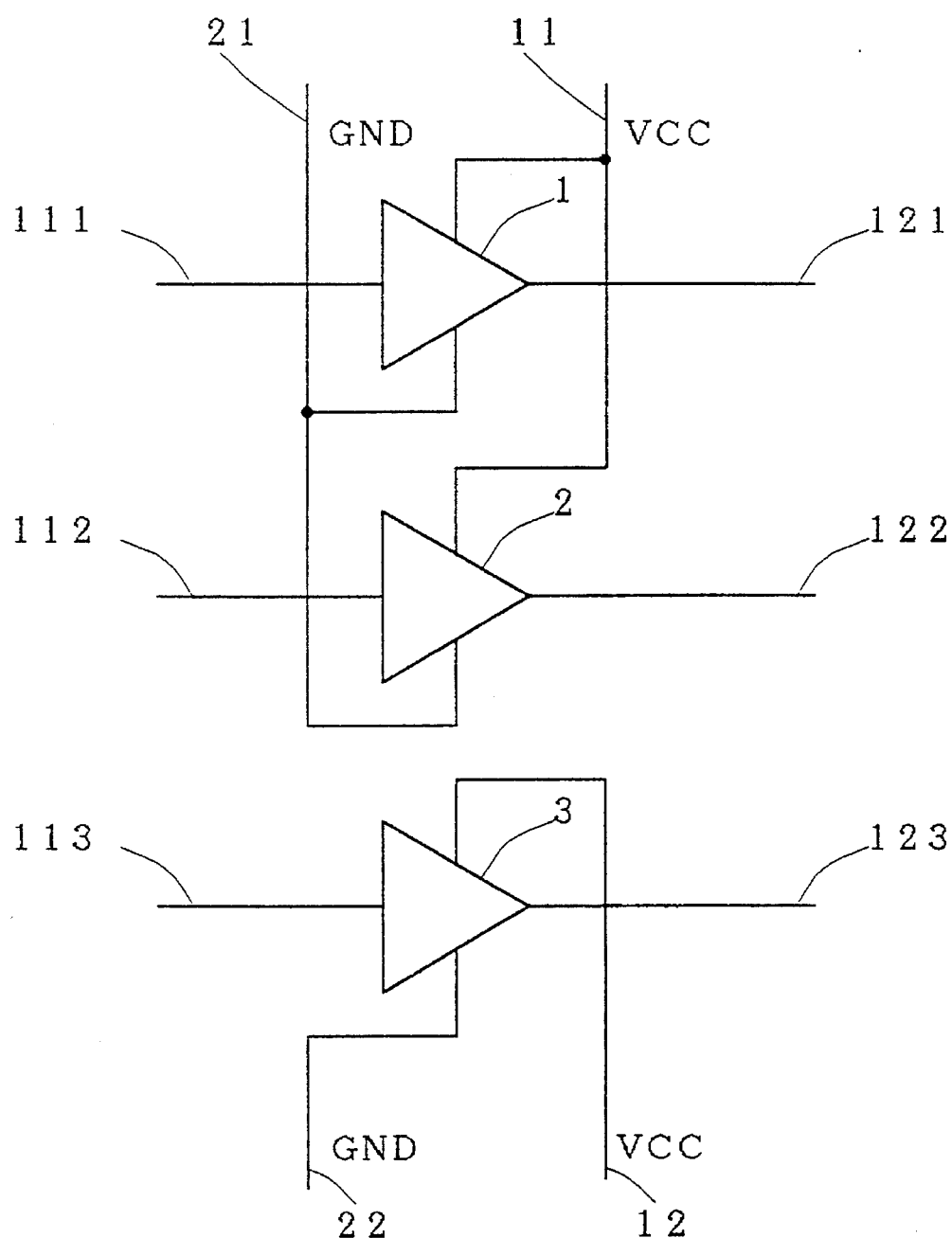
Figure 23:
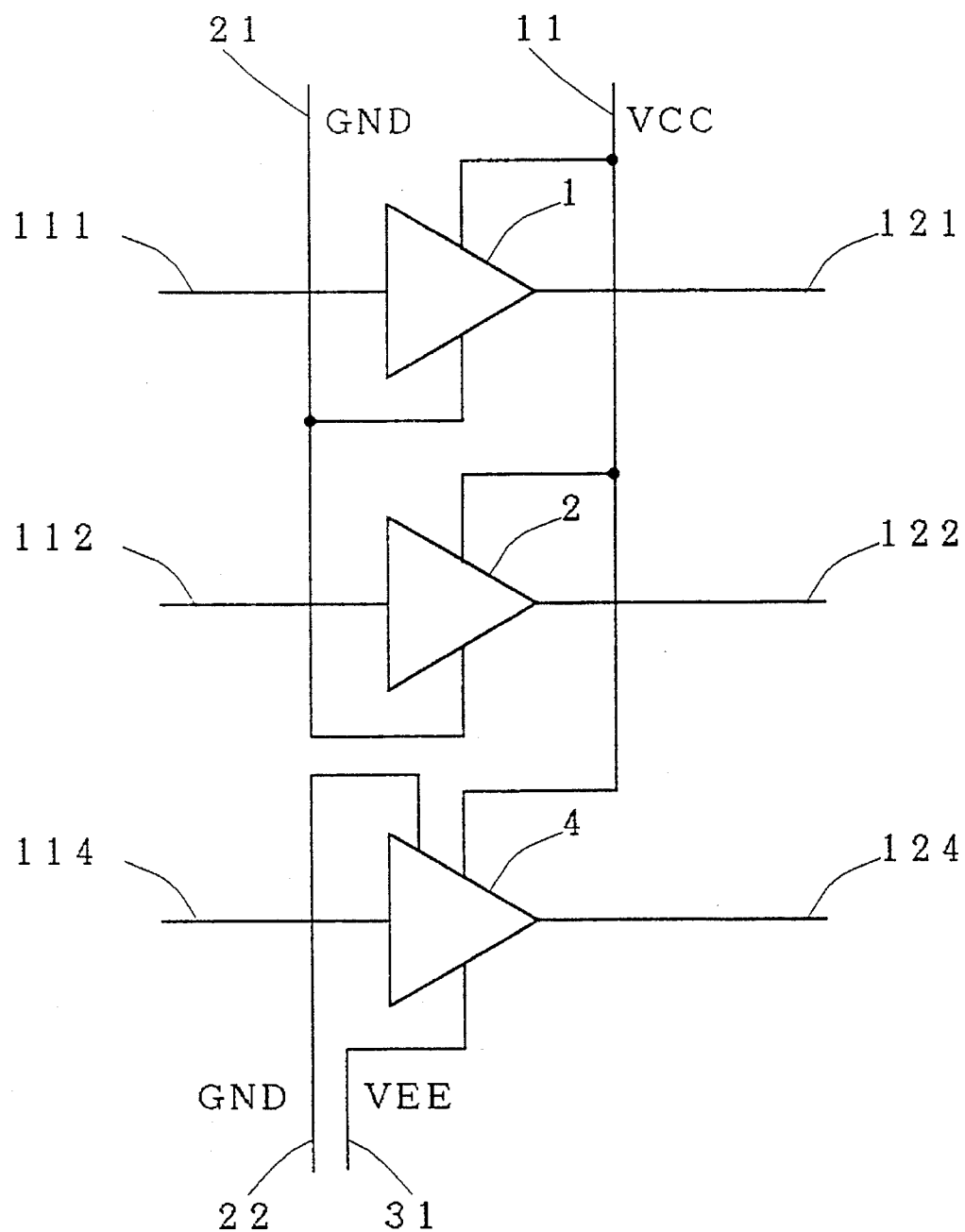
Figure 24:
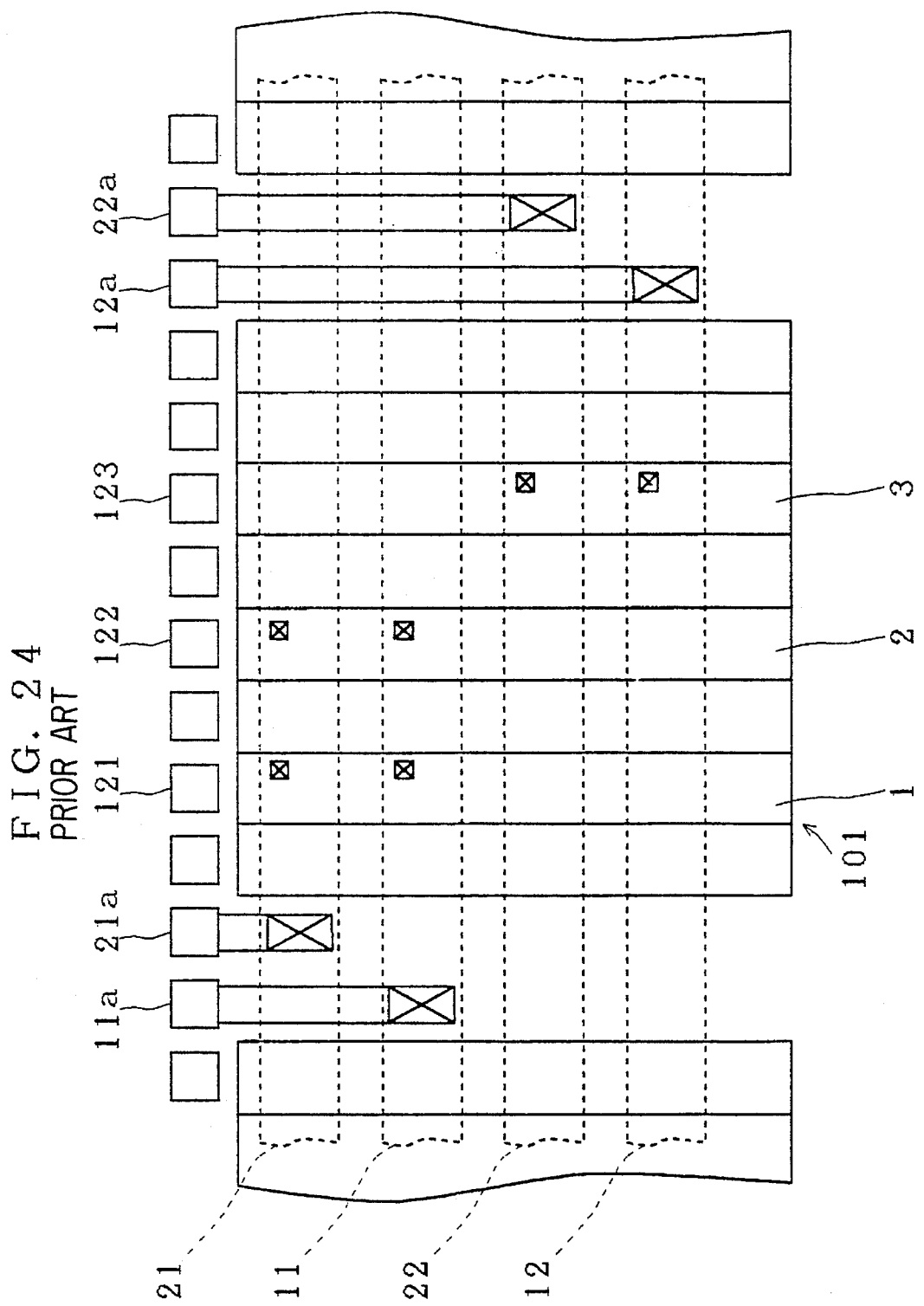
FIG. 24 is a plan view showing the conventional technique.

Thus, the power source line for supplying electric power to the output buffers 1 and 2 and the power source line for supplying electric power to output buffer 3 are separated from each other, and therefore, inter-circuit interference such as a switching noise is prevented from occurring between the two. As another advantage, the area for disposing the output buffers only needs be wider than the width of two power source lines. The structure shown in FIG. 1 corresponds to connections made within the output buffer portion 100 of FIG. 22. Compared with the structure of FIG. 24 which includes the connections made within the conventional output buffer portion 100 of FIG. 22, the structure of FIG. 1 has a largely improved circuit integration.

In addition, the structure of FIG. 1 reduces the possibility that a resistance or inductance component will exert an adverse influence due to long wires connecting the pads and the buffers.

Except for an arrangement in which the output buffer 3 is disposed between the output buffers 1 and 2, the output buffers 1 and 2 may be located with respect to each other in any desired arrangement. For example, where eight buffer areas each having the structure shown in FIG. 1 are disposed adjacent to each other, in each buffer area, the output buffer 1 may be located at the left-side end and the output buffer 3 may be located at the right-side end. That is, in the first preferred embodiment, although it is necessary that buffers to be connected to the same power source line are disposed adjacent to each other, the positions and the number of the buffers need not be completely determined. In this regard, the designing freedom of designing the buffers is ensured.

FIG. 1 shows only the power source lines which are disposed in the region which faces the power source pads 11a and 21a on the left-hand side and the power source pads 12a and 22a on the right-hand side. However, the present invention can be realized also in the region which is on the left-hand side of the power source pads 11a and 21a and in the region which is on the right-hand side of the power source pads 12a and 22a.

Figure 2:
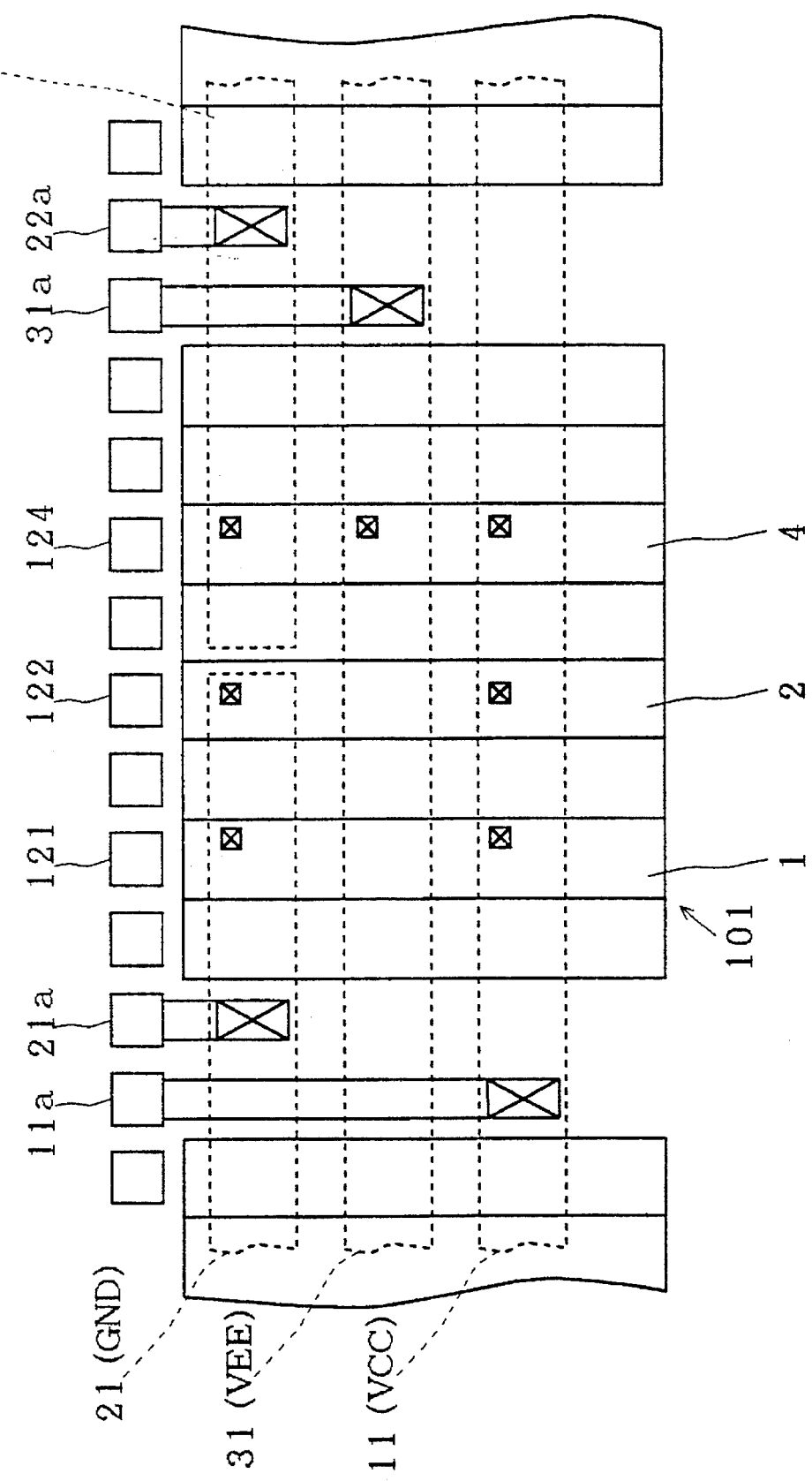
FIG. 2 is a plan view showing a second preferred embodiment of the present invention.

(A-2) Second Preferred Embodiment:

FIG. 2 is a plan view showing a structure of a second preferred embodiment of the present invention. TTL type output buffers 1 and 2 and an ECL type output buffer 4 are disposed in the area 101. Above the area 101, there are provided power source lines 21, 22, 11 and 31.

In a similar manner to the first preferred embodiment, the output buffer 1 is connected to the power source lines 11 and 21 by through holes and the output buffer 2 is connected to the power source lines 11 and 21. On the other hand, the output buffer 4 is connected to the power source lines 11, 22 and 31, and although not shown in FIG. 2 in detail, to a pad 124 as well. The power source line 31 is connected to a power source pad 31a. Since the potential VEE is supplied to the power source pad 31a, the output buffer 4 receives the three different potentials VCC, VEE and GND. In the second preferred embodiment, the potential VCC is available only from the power source line 11 to which all of the output buffers 1, 2 and 4 are connected.

Thus, inter-circuit interference is prevented also by separating only the power source lines for supplying the ground potential GND into the one for supplying the potential to the output buffers 1 and 2 (power source line 21) and the one for supplying the potential to the output buffer 4 (power source line 2). This approach is particularly advantageous where ECL type buffers are used together with other types of buffers. In such a case, since using ECL type buffers requires an increased number of necessary power source lines, even a reduction in the size of the area 101 due to separation of the GND-supplying power source lines alone is very desirable for enhancing the integration of the semiconductor integrated circuit device. Further, an adverse influence of an inductance component is prevented because the wiring length between the pads and the buffers is short.

B. Preferred Embodiment Applied to Inner Logic Circuit:

The present invention is not limited to an input/output buffer, but is also applicable to a logic block which is disposed within an input/output buffer of a semiconductor integrated circuit device.

Figure 3:
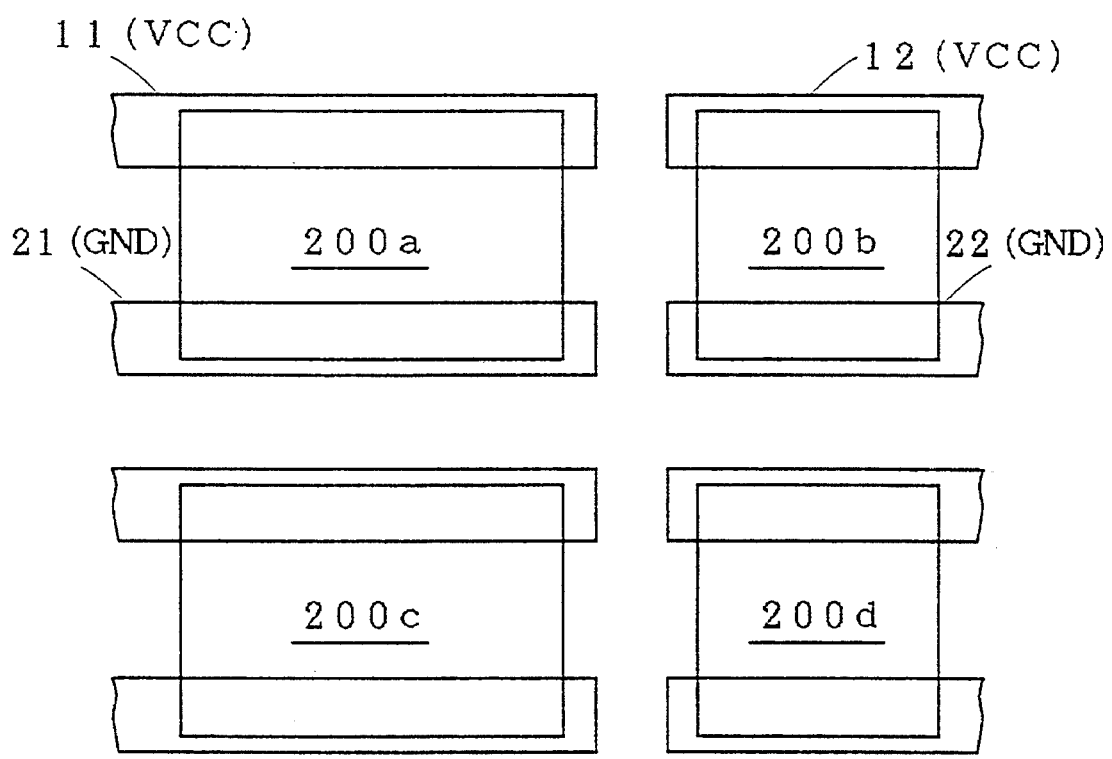
FIG. 3 is a plan view showing a third preferred embodiment of the present invention.

(B-1) Third Preferred Embodiment:

FIG. 3 is a plan view diagrammatically showing a structure of a logic block to which the present invention is applied. Logic blocks 200a, 200b, 200c and 200d need connection to the potential VCC and the potential GND. The potential VCC is supplied on the power source lines 11 and 12 while the potential GND is supplied on the power source lines 21 and 22, for instance. The power source lines 11 and 12 extend along a common straight line while the power source lines 21 and 22 extend on a different common straight line. The power source lines 11 and 12 are not directly connected to each other, nor are the power source lines 21 and 22.

On the other hand, since the logic blocks 200a and 200b are arranged in the same direction in which the power source lines 11, 12, 21 and 22 extend, and the four power source lines 11, 12, 21 and 22 are all disposed in the two lines of width, interference between the logic blocks 200a and 200b is prevented without deteriorating the circuit integration.

This is the same with the logic blocks 200c and 200d as well. Since a very large number of logic block arrays are formed in a semiconductor integrated circuit device, prevention of deterioration in this manner in the circuit integration where logic blocks are arranged in an array is particularly advantageous considering the expected future increase in the integration of semiconductor integrated circuit devices.

(B-2) Fourth Preferred Embodiment:

Where TTL type logic blocks and ECL type logic blocks are to be formed together in a semiconductor integrated circuit device, due to a difference in the output amplitude and a difference in the level of required potentials between the TTL type logic blocks and the ECL type logic blocks, TTL type logic blocks and the ECL type logic blocks should be designed separately and mounted onto the same semiconductor integrated circuit device.

Figure 4:
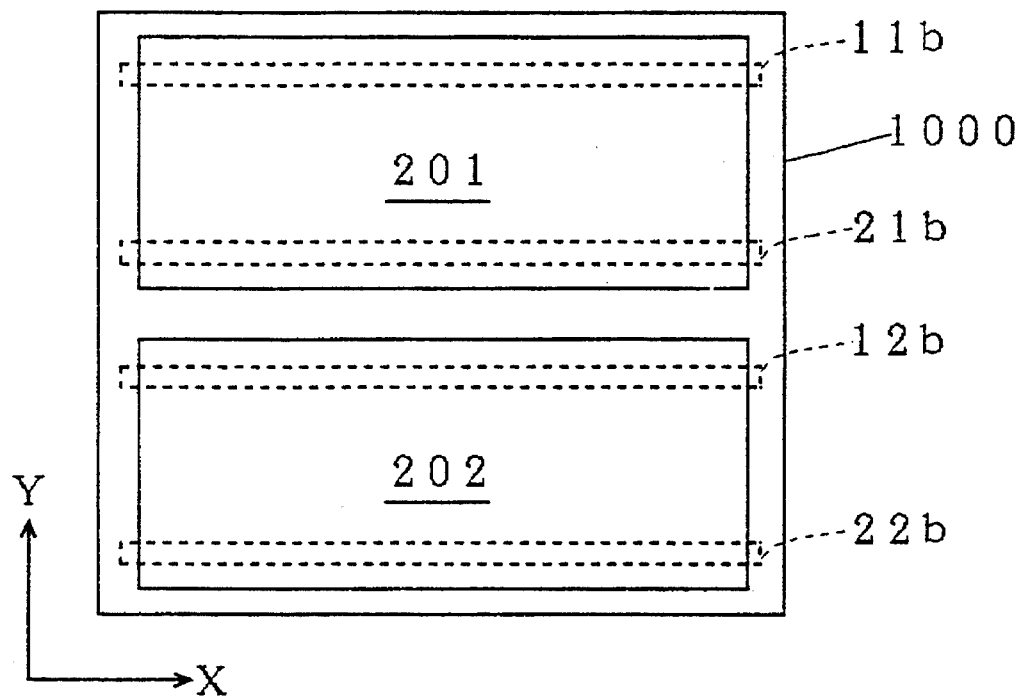
FIGS. 4 to 6 are plan views explaining a fourth preferred embodiment of the present invention.

FIG. 4 is a plan view diagrammatically showing a structure of such a semiconductor integrated circuit device. For clarity, input/output buffers are not illustrated. A number of power source lines are disposed in a direction X within an inner region 1000. However, FIG. 4 shows only four power source lines 11b, 21b, 12b and 22b and omits the others for simplicity of illustration.

If both TTL type logic blocks and ECL type logic blocks are to be formed in the inner region 1000, a power source line for supplying a potential to the TTL type logic blocks and a power source line for supplying a potential to the ECL type logic blocks must be separated from each other, or otherwise, inter-circuit interference will occur between the TFL type and the ECL type logic blocks. In addition, the power source lines which are to be connected to each other are not necessarily spaced apart from each other by the same distance in some cases since the TTL type and the ECL type logic blocks are designed separately. Hence, if the conventional technique is to be applied to the inner region 1000 having such a structure, it will be necessary to dispose two types of areas 201 and 202 adjacent to each other in the direction X and to form the TTL type logic blocks in the area 201 and ECL type logic blocks in the area 202. In addition, different types of logic blocks will have to be provided with potentials from different power source lines; that is, the power source lines 11b and 21b supplying a predetermined potential to the logic blocks which are disposed within the area 201 while the power source lines 12b and 22b supplying a predetermined potential to the logic blocks which are disposed within the area 202. Interference between the circuits must be prevented in this manner.

However, this approach is not desirable since if the number of transistors of the TTL type logic blocks (or of the ECL type logic blocks) needs to be changed, transistors arranged in an array of a direction Y which runs perpendicular to the direction X must be changed from the TTL type logic block transistors to the ECL type logic block transistors or vice versa. In general, the number of transistors counted in a direction of a power source line (i.e., in the direction X) is greater than the number of transistors counted in the direction Y, and therefore, a TTL-to-ECL or an ECL-to-TTL change could cause some of the transistors to be left useless, which would in turn deteriorate the circuit integration.

This problem will be solved by firming two types of areas each extending in a direction which runs perpendicular to the direction of the power source lines (i.e., in the direction Y) and supplying predetermined potentials by different power source lines to the areas. In short, the designing freedom is increased with respect to a decision about which type of logic block will have to be formed using the transistors.

Figure 5:
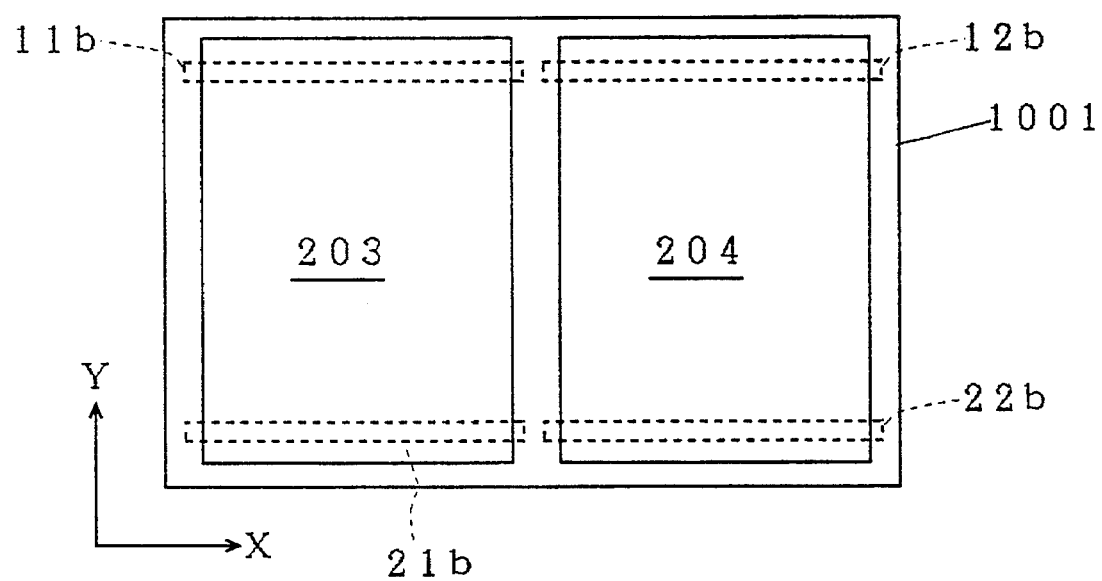

FIG. 5 is a plan view showing a structure of an inner region 1001 in which areas 203 and 204 are formed spaced apart from each other in a direction X so as to extend in a direction Y. In such a structure, separation of the power source lines according to the present invention is possible. That is, the power source lines 11b and 12b are disposed on the same straight line but are separated from each other at a boundary between the areas 203 and 204. This is also true for the power source lines 21b and 22b. Hence, prevention of inter-circuit interference and an enhanced designing freedom are realized at the same time.

Thus, when the present invention is applied to an inner region in which different types of logic blocks are disposed in different areas, it is desirable to design the areas using cells which are applicable to both the TTL type and the ECL type. This is because if it is possible to form any type of logic block merely by changing the interconnections, elements such as transistors once designed to form a TTL type logic block can be easily changed to form an ECL type logic block, thereby enhancing the effect of the present invention.

Figure 6:
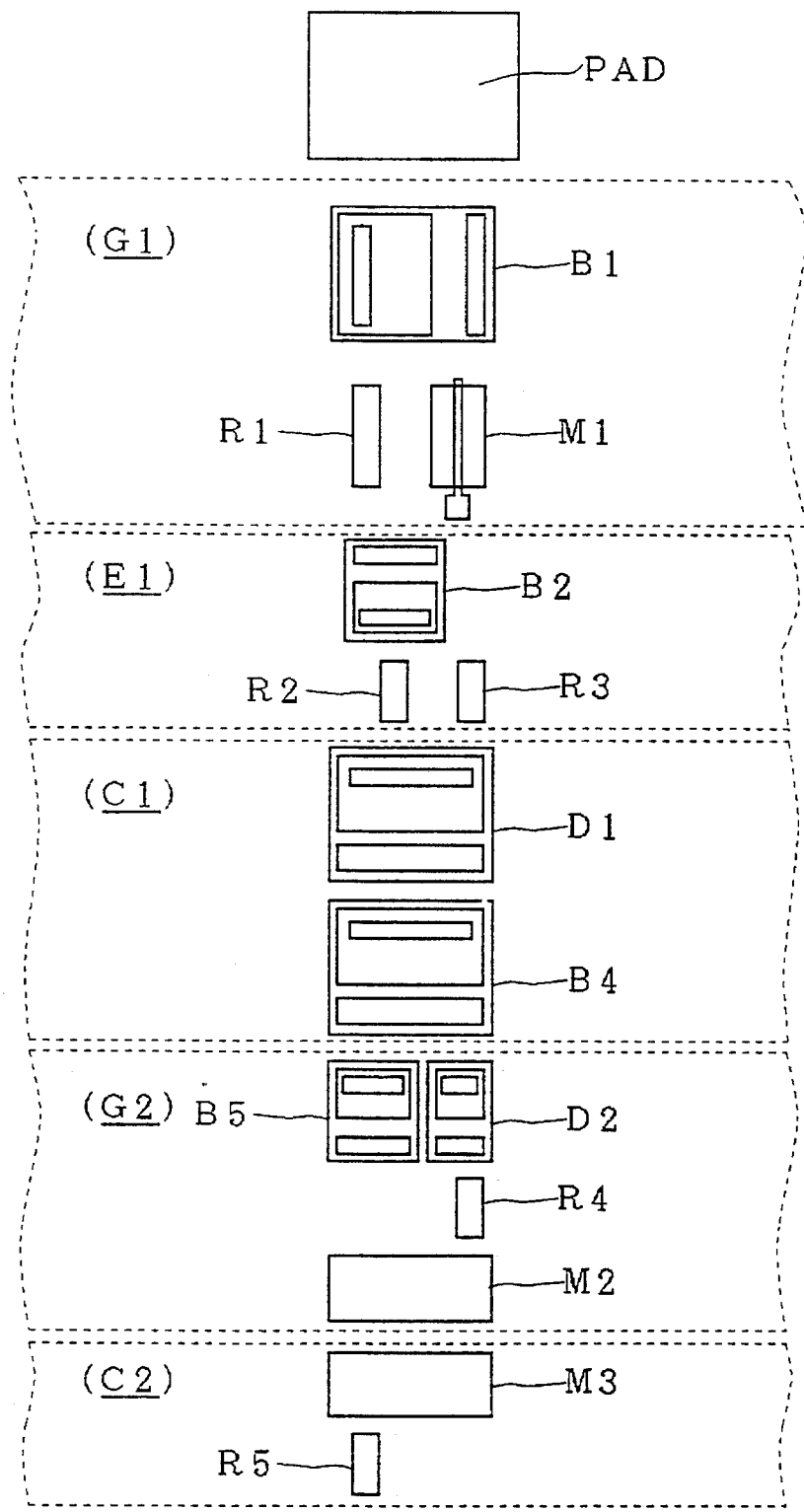

FIG. 6 is a plan view showing an example of a cell which is applicable to both the TTL type and the ECL type. Above a bipolar transistor B1, a MIS transistor M1 and a resistor R1, there is disposed a power source line G1 for providing the ground potential GND. Above a bipolar transistor B2 and resistors R2 and R3, a power source line E1 for providing the potential VEE is formed. Further, a power source line C1 for providing the potential VCC is formed above a diode D1 and a bipolar transistor B4 while a power source line G2 for providing the ground potential GND is formed above a diode D2, a bipolar transistor B5, a resistor R4 and a MIS transistor M2. Above a MIS transistor M3 and a resistor R5, a power source line C2 for providing the potential VCC is formed. In FIG. 6, for ease of distinguishing the respective elements, the power source lines are shown by the dotted lines.

Figure 7:
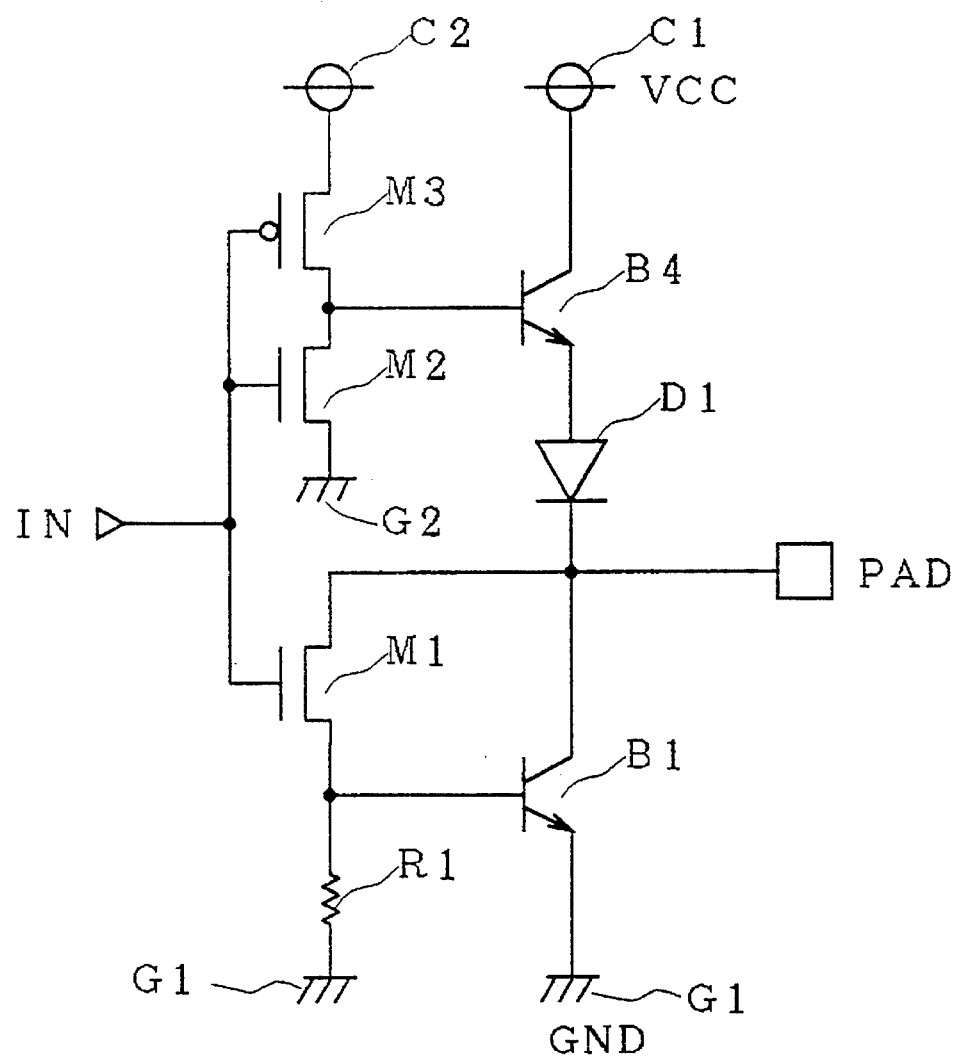
FIG. 7 is a circuitry diagram explaining the fourth preferred embodiment of the present invention.
Figure 8:
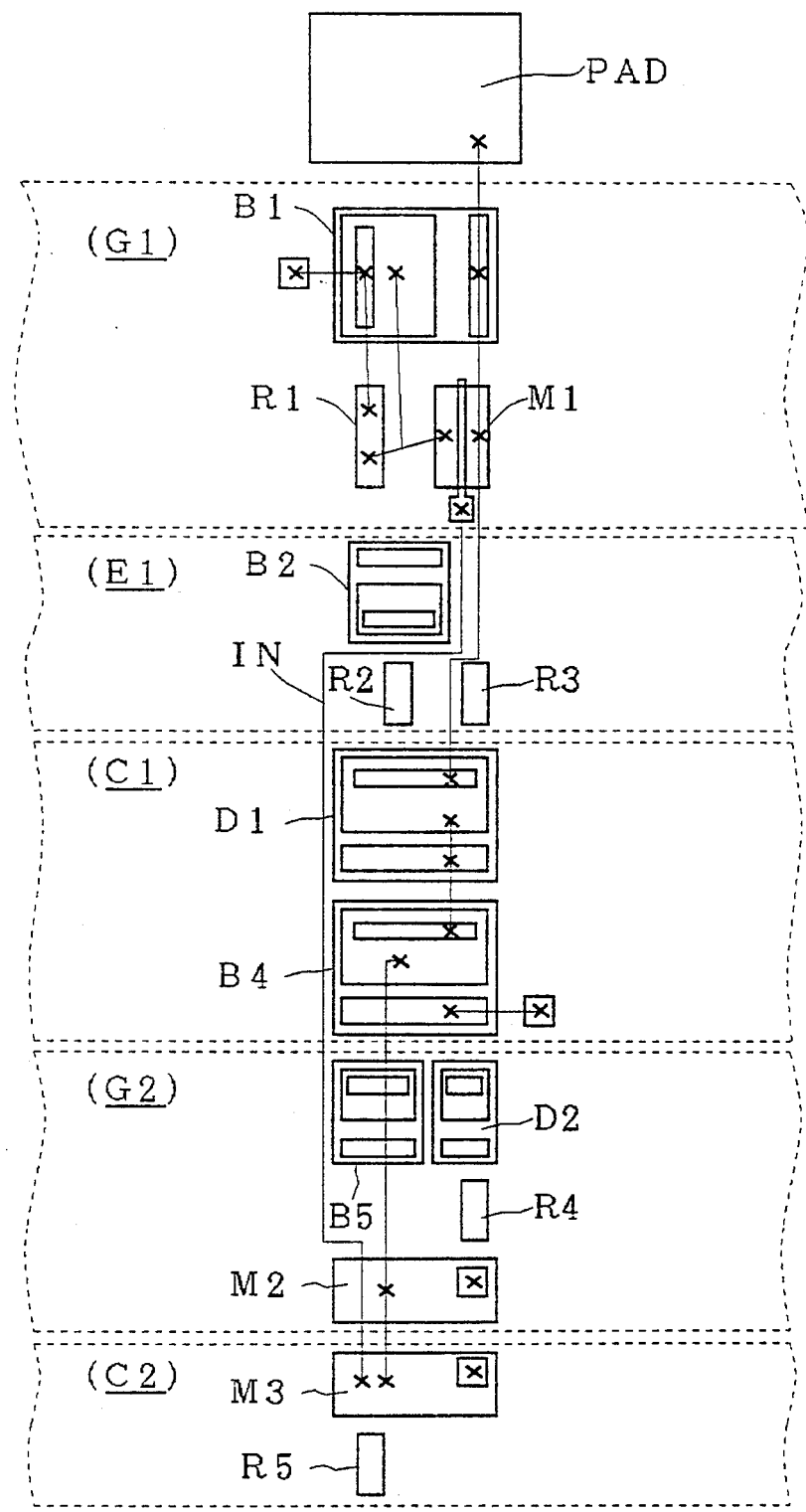
FIG. 8 is a plan view explaining the fourth preferred embodiment of the present invention.

FIG. 7 is a circuitry diagram showing an example of a structure of the TTL type logic block and FIG. 8 is a plan view showing the TTL type logic block of FIG. 7 completed by connecting the cells of FIG. 6. In FIG. 8, the cross marks represent connection points between the wires and the elements. Of the cross marks, those enclosed in rectangles represent connections (i.e., via holes) with the power source lines which are disposed above. In such a structure, the potential VEE which is available from the power source line E1 is not necessary, and the bipolar transistor B2 and the resistors R2 and R3 do not form a logic block.

Figure 9:
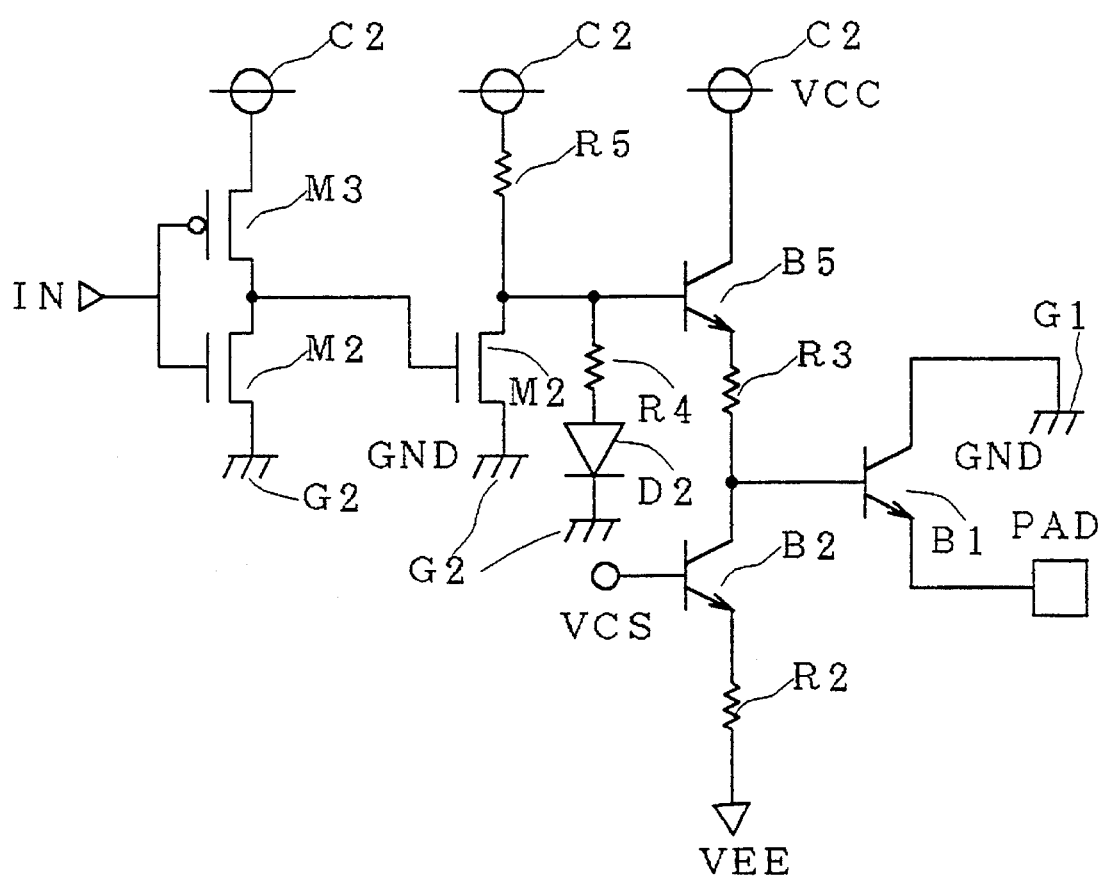
FIG. 9 is a circuitry diagram explaining the fourth preferred embodiment of the present invention.
Figure 10:
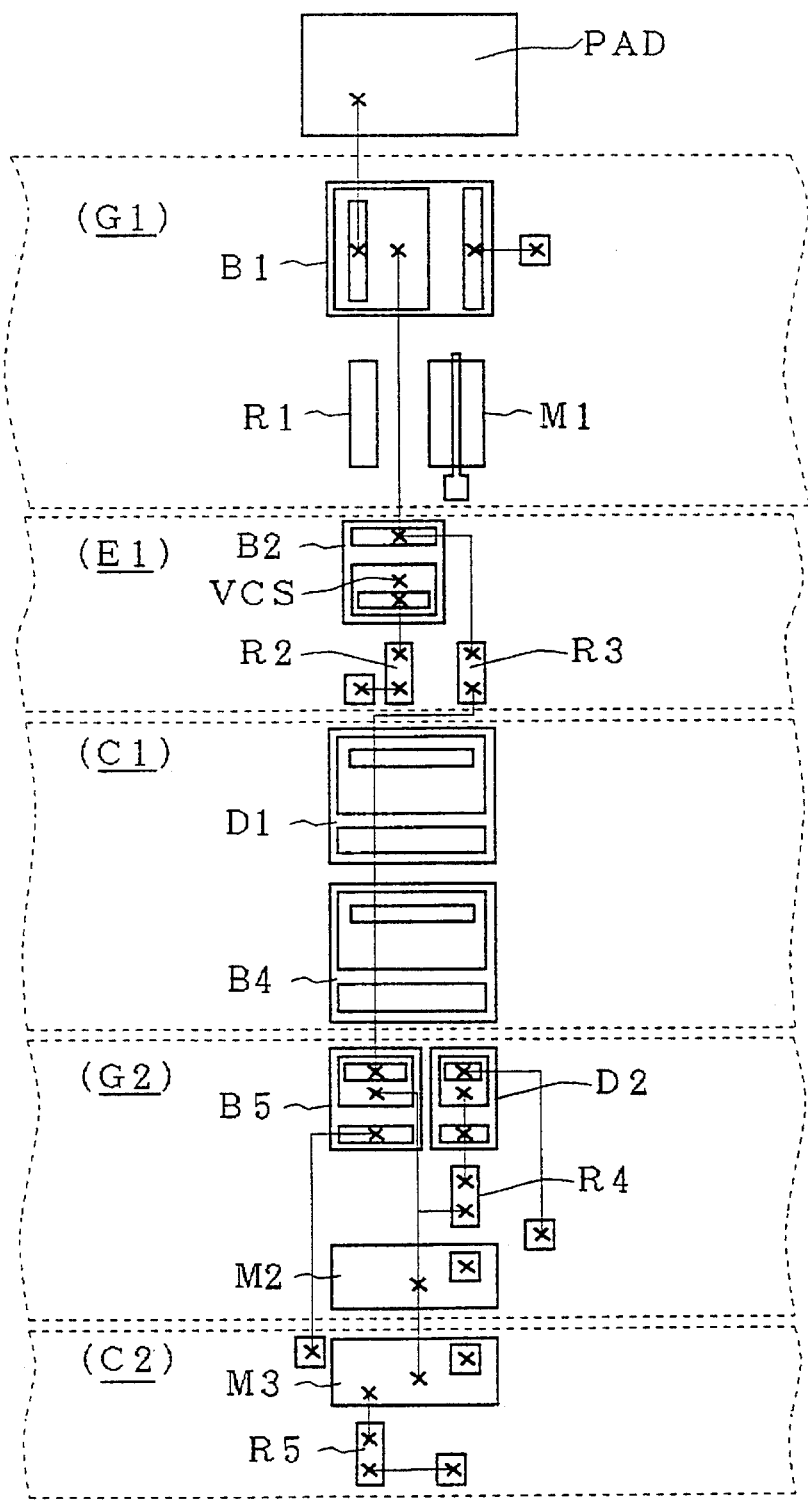
FIG. 10 is a plan view explaining the fourth preferred embodiment of the present invention.

FIG. 9 is a circuitry diagram showing an example of a structure of the ECL type logic block and FIG. 10 is a plan view showing the ECL type logic block of FIG. 9 completed by connecting the cells of FIG. 6. In this case, the potential VCC which is available from the power source line C1 is not necessary, and the bipolar transistor B4 and the diode D1 do not form a logic block.

As shown in FIGS. 8 and 10, it is possible to form both the TTL type and the ECL type logic blocks using the cells of FIG. 6. Hence, by forming the inner region of the semiconductor integrated circuit device using such cells, an application of the present invention is easily realized. The TTL type logic blocks and the ECL type logic blocks are formed respectively in the areas 203 and 204 using a group of the same cells as shown in FIG. 5, and the power source lines G1, E1, C1, G2 and C2 are separated between the areas 203 and 204. By adopting such a structure, inter-circuit interference between the TTL type and the ECL type logic blocks is prevented while improving the circuit integration.

Of course, it is possible to separate the power source lines for the TTL type logic blocks from each other within the area 203 in the manner described in relation to the third preferred embodiment. Similarly, it is possible to separate the power source lines for the ECL type logic blocks from each other within the area 204 in the manner described in relation to the third preferred embodiment.

(B-3) Fifth Preferred Embodiment:

The present invention is not only applicable to cases where digital circuits having different amplitudes such as TTL type and ECL type circuits are to be used together, but also to where a digital circuit and an analog circuit are to be used together. An analog circuit in particular, as compared with a digital circuit, includes many portions which are automatically designed, and therefore, a digital circuit and an analog circuit are designed separately in many cases. In order to apply the present invention to such a case, it is desired to form the inner region using cells from which both a digital circuit and an analog circuit can be formed by merely modifying connections.

Figure 11:
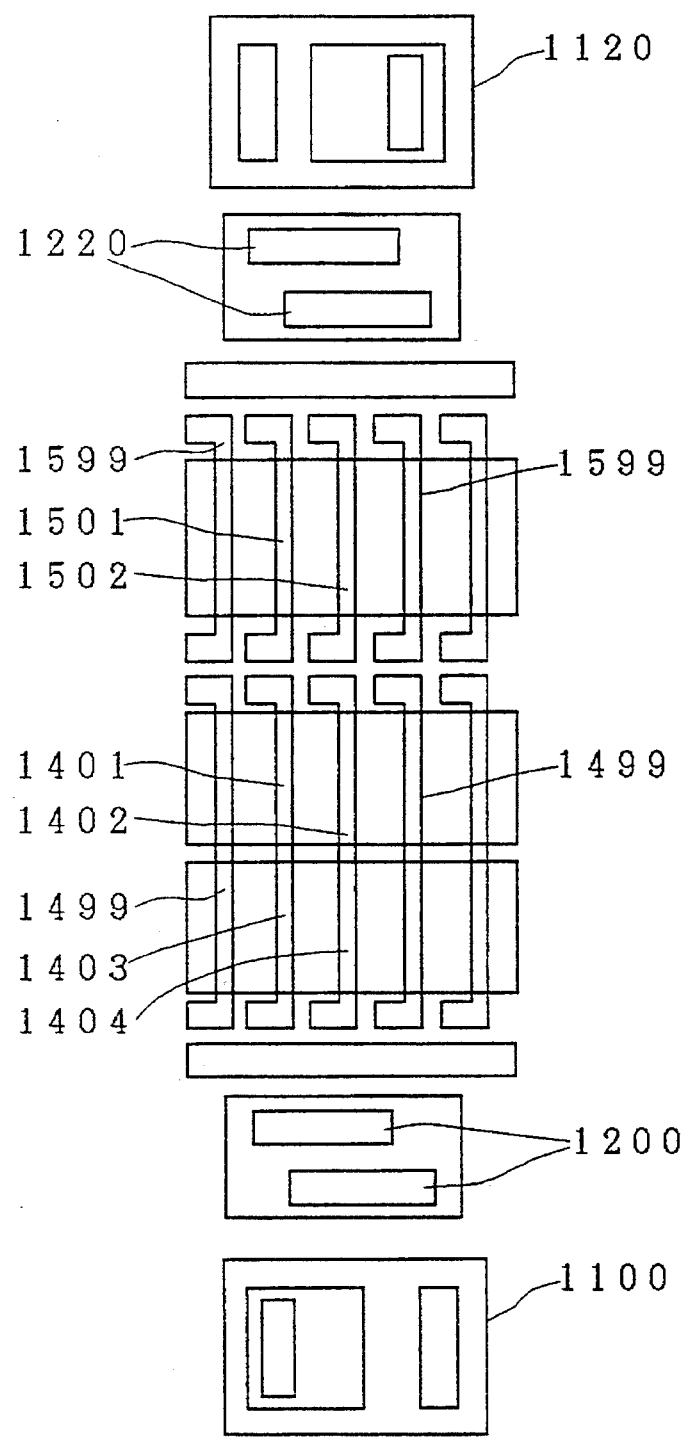
FIG. 11 is a plan view explaining a fifth preferred embodiment of the present invention.

FIG. 11 is a plan view showing an example of a cell which is applicable to both a digital circuit and an analog circuit. Among techniques regarding such a cell are "IEICE Technical Report" Vol. 89, No. 205, pgs 49–55 (ICD89-118) and Japanese Patent Laid-Open Gazette No. 3-6858.

The cell shown in FIG. 11 includes bipolar transistors 1100 and 1120, PMOS transistors 1599, 1501 and 1502, NMOS transistors 1499, 1401, 1402, 1403 and 1404 and resistors 1200 and 1220.

Figure 12:
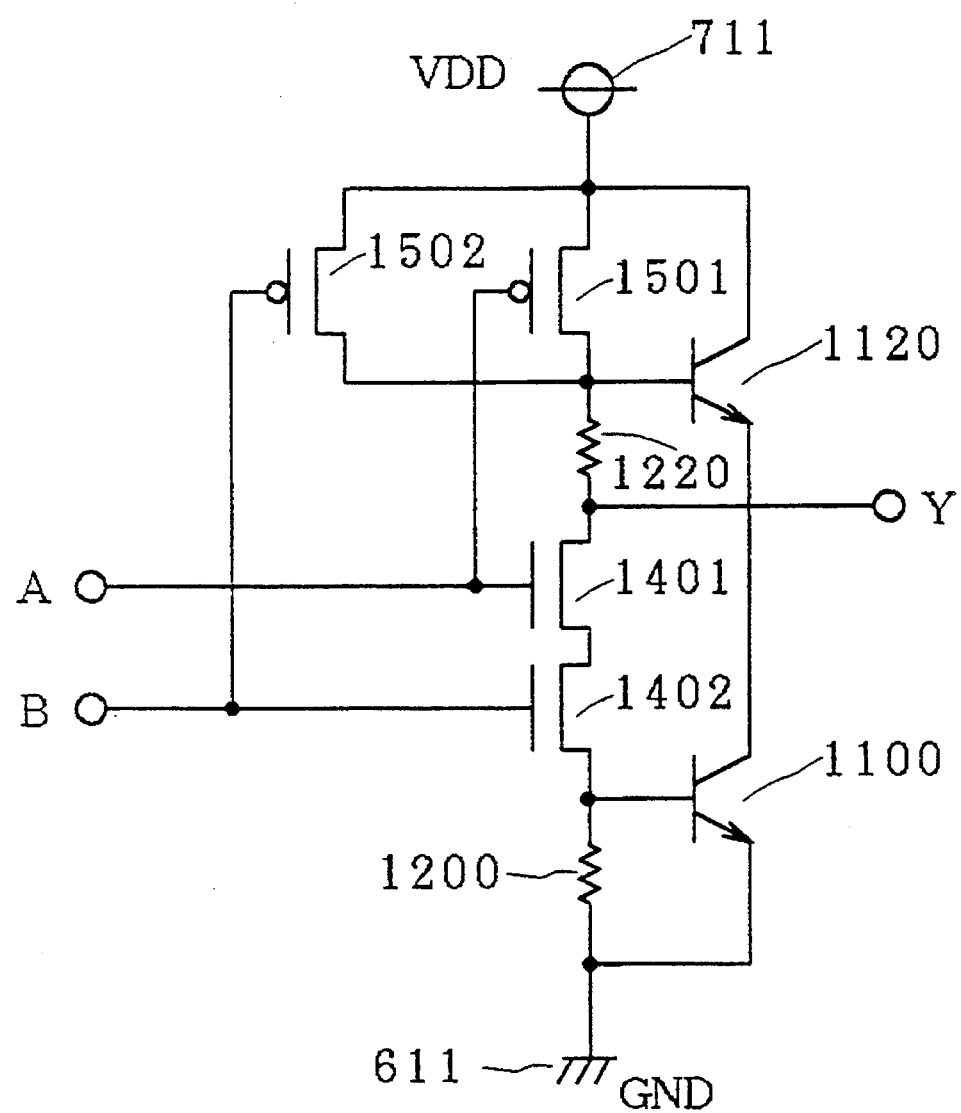
FIG. 12 is a circuitry diagram explaining the fifth preferred embodiment of the present invention.
Figure 13:
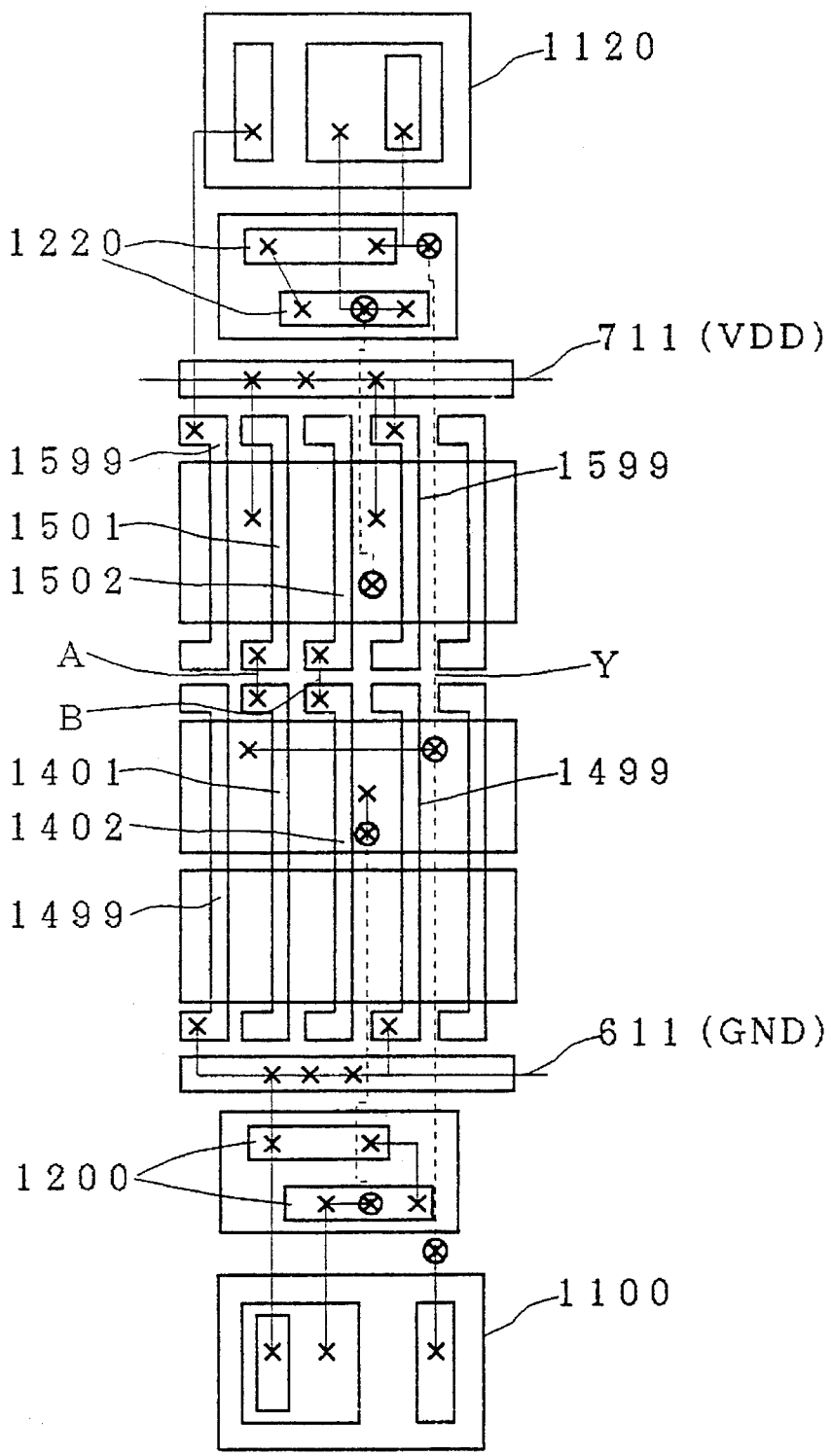
FIG. 13 is a plan view explaining the fifth preferred embodiment of the present invention.

FIG. 12 is a circuitry diagram showing an example of a digital circuit which can be formed using a cell such as that shown in FIG. 11. FIG. 13 is a plan view showing connections made to the cell of FIG. 11 to form the digital circuit of FIG. 12. In FIG. 13, wires, shown by the thin solid lines and the thin dotted lines, are formed in different layers and therefore are isolated from each other. The cross marks represent connection points between the wires and elements. Encircled cross marks represent via holes which connect the wires which are formed in different layers to each other. The MOS transistors 1599 and 1499 of the cell do not contribute to formation of the digital circuit of FIG. 12. Rather, the MOS transistors 1599 and 1499 are provided so as isolate the elements.

Figure 14:
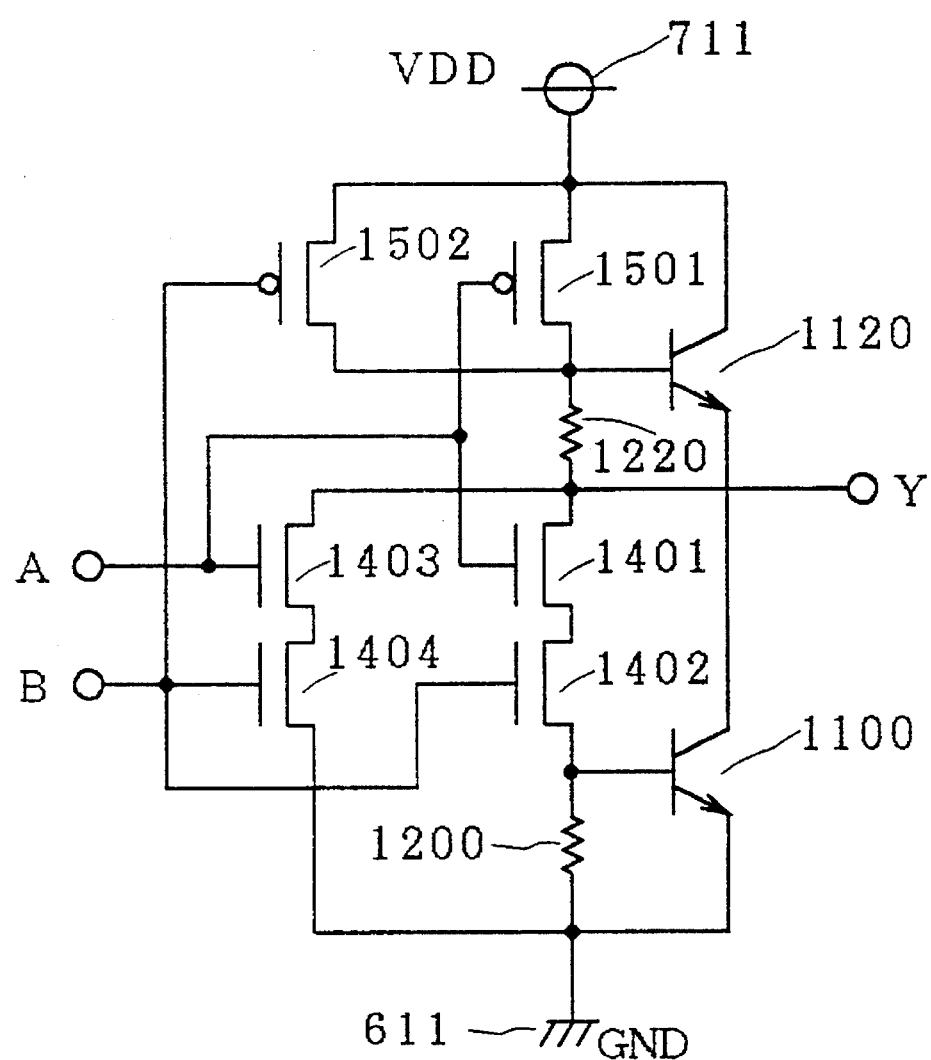
FIG. 14 is a circuitry diagram explaining the fifth preferred embodiment of the present invention.
Figure 15:
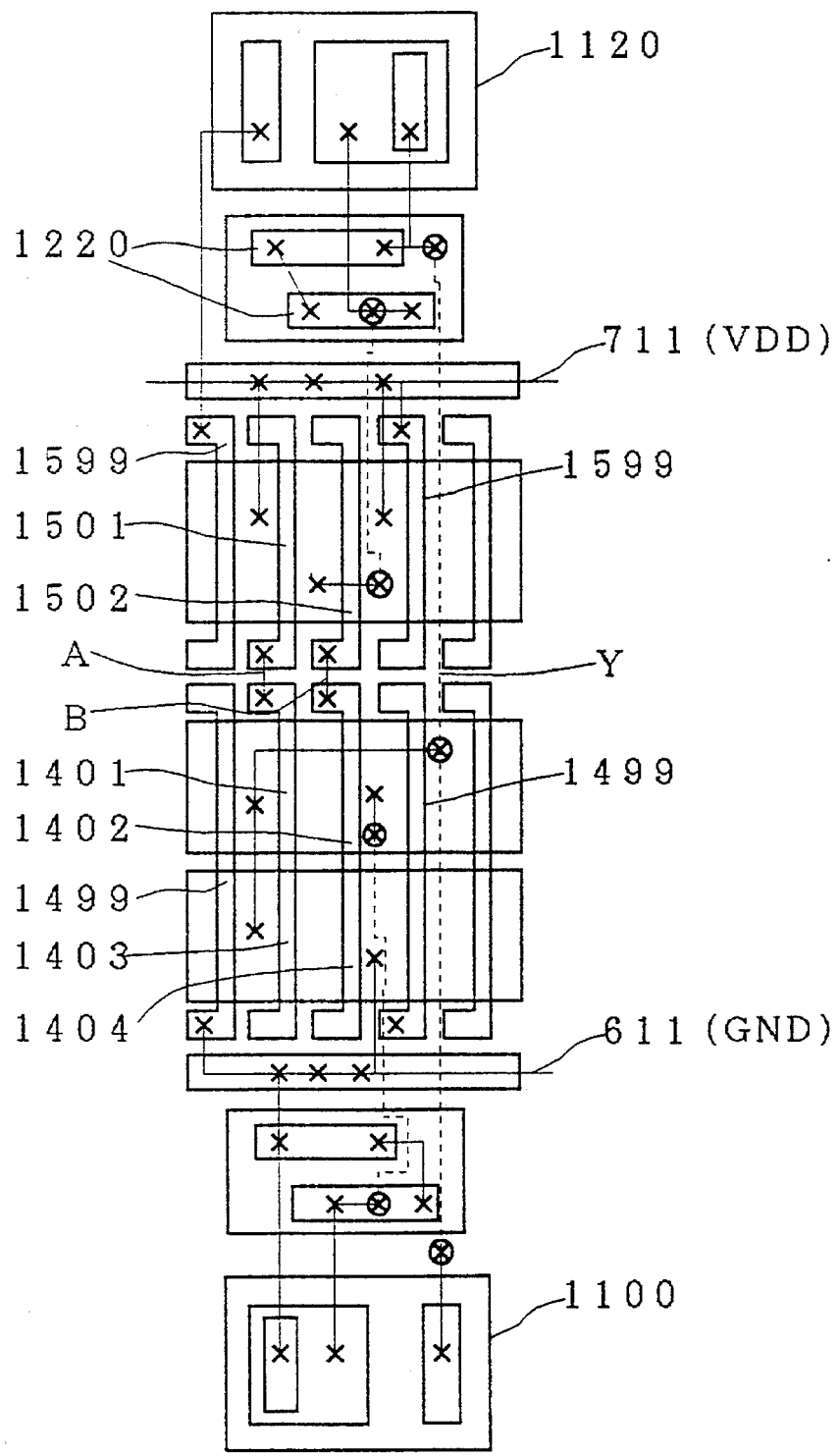
FIG. 15 is a plan view explaining the fifth preferred embodiment of the present invention.

FIG. 14 is a circuitry diagram showing another example of a digital circuit which can be formed using a cell such as that shown in FIG. 11. FIG. 15 is a plan view showing connections made to the cell of FIG. 11 to form the digital circuit of FIG. 14. In this structure as well, the MOS 1599 and 1499 are not formed as part of the digital circuit of FIG. 14, but only so as to isolate the elements.

Figure 16:
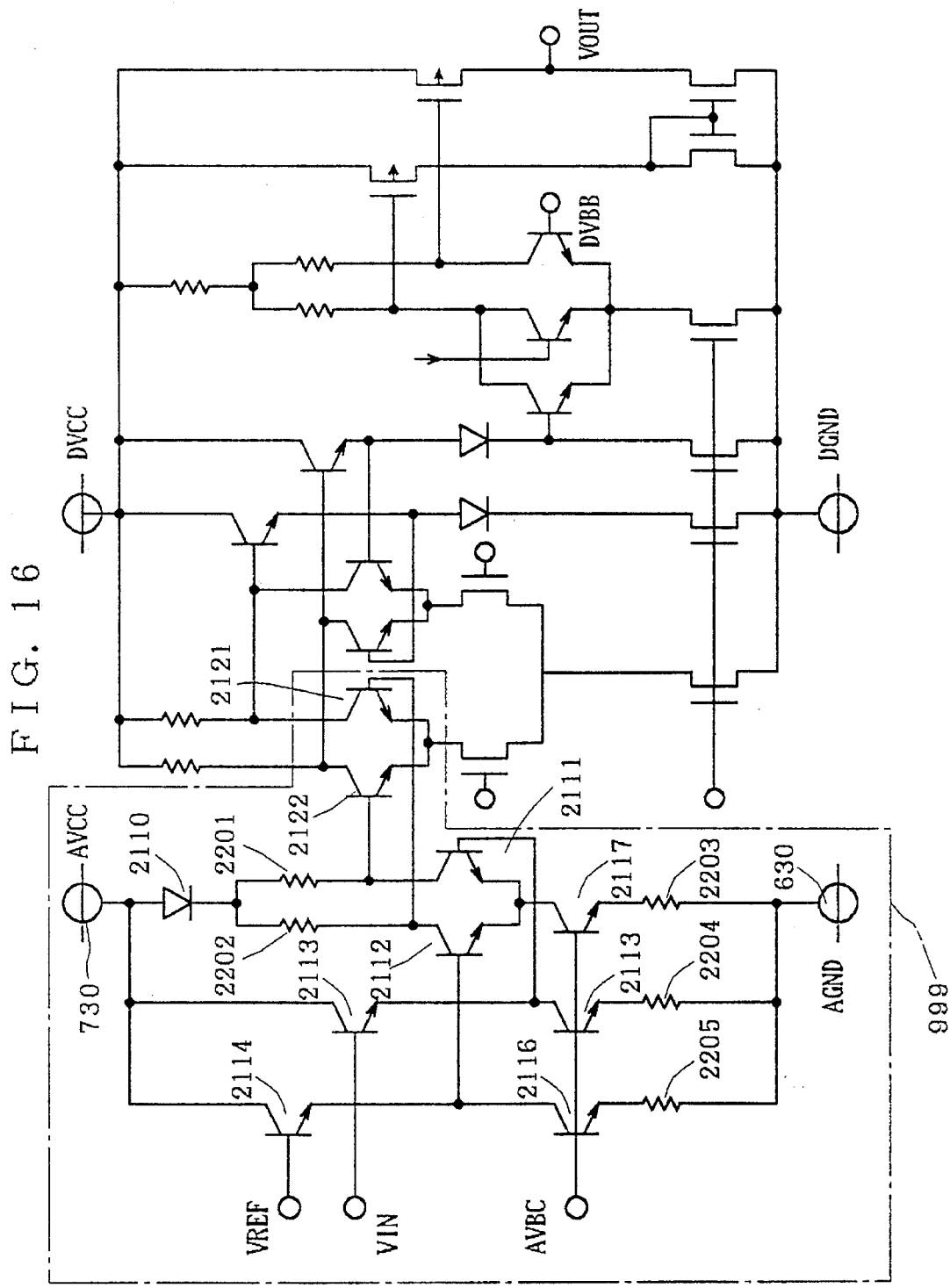
FIG. 16 is a circuitry diagram explaining the fifth preferred embodiment of the present invention.
Figure 17:
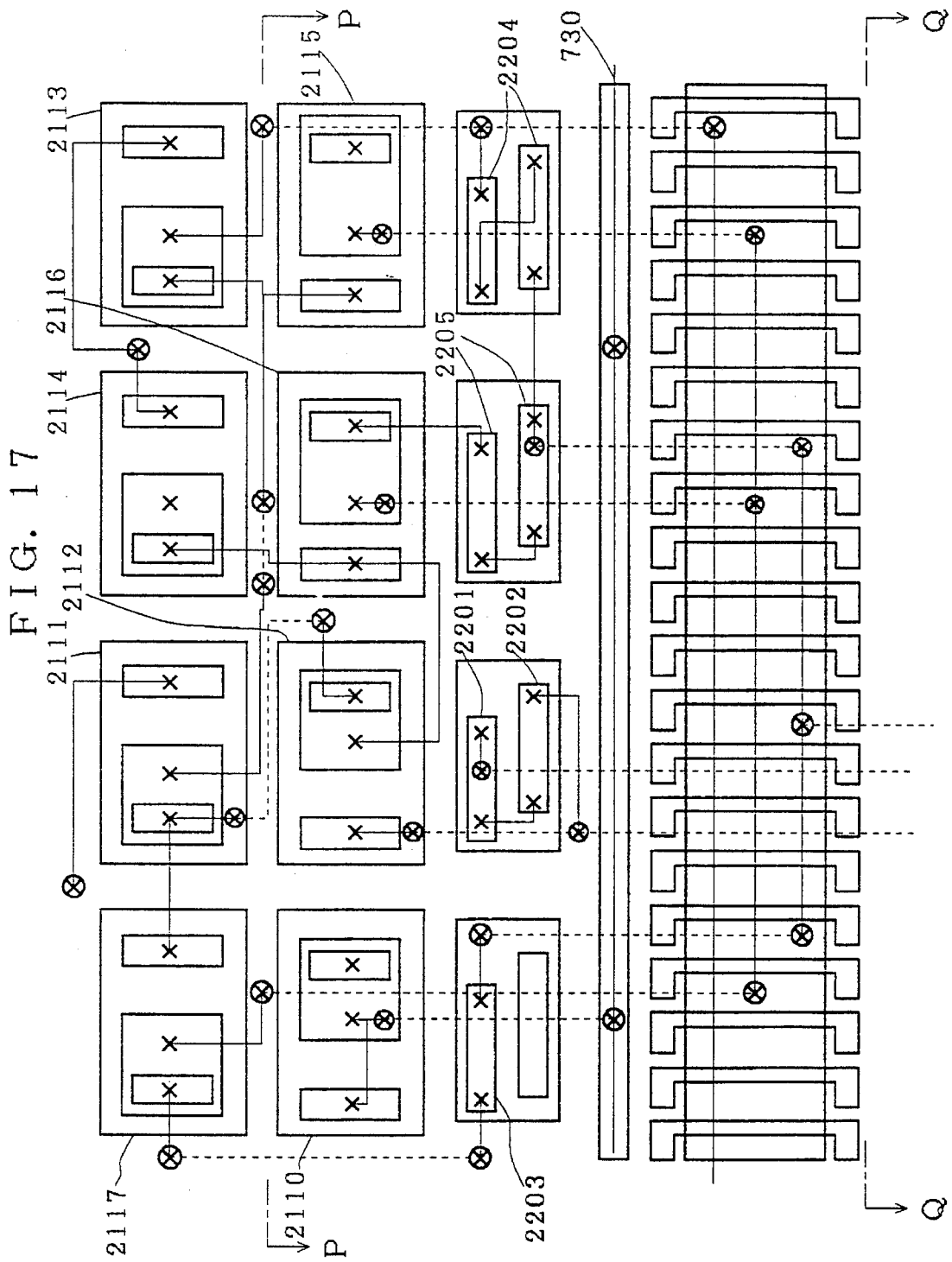
FIGS. 17 and 18 arc plan views explaining the fifth preferred embodiment of the present invention.
Figure 18:
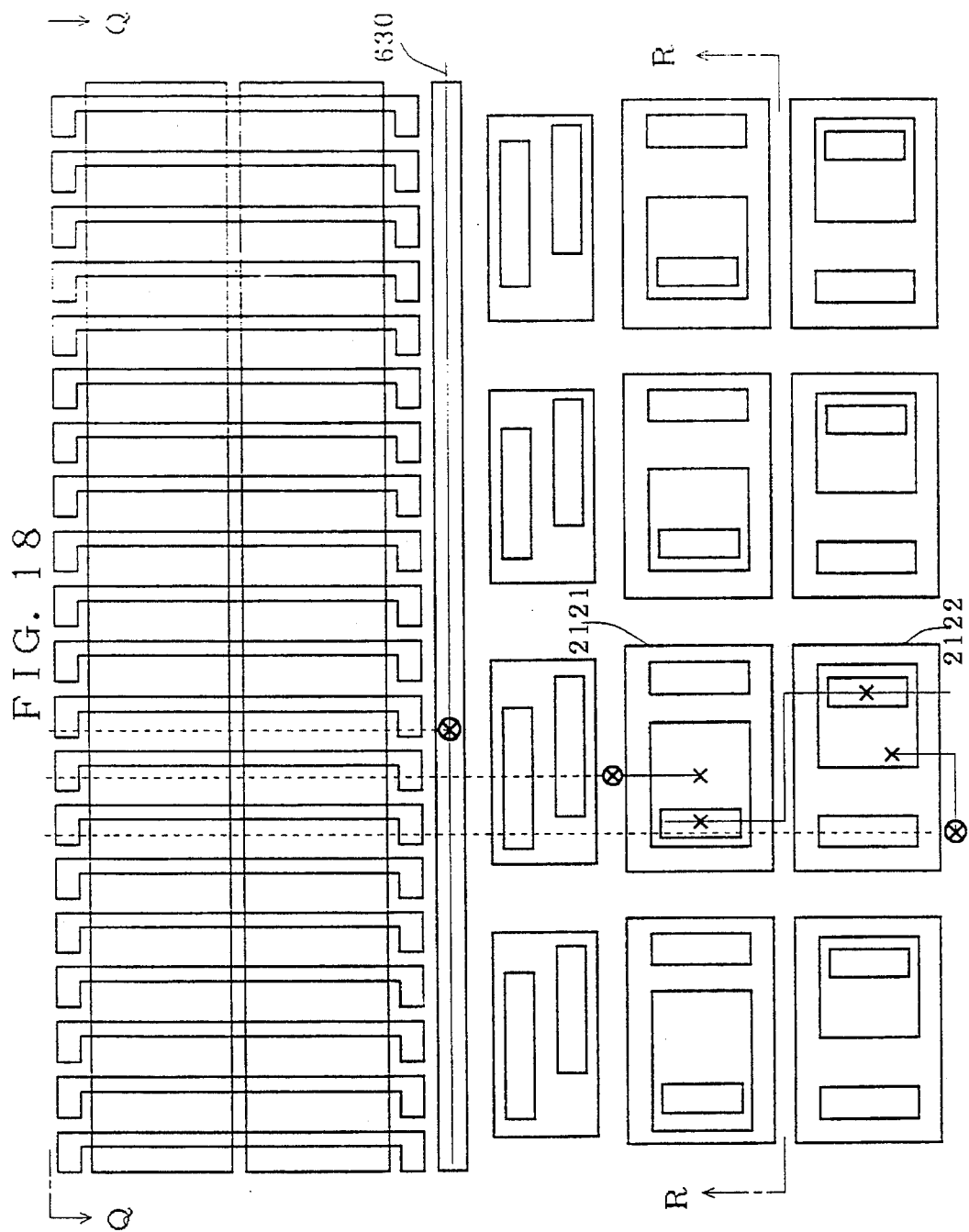
Figure 19:
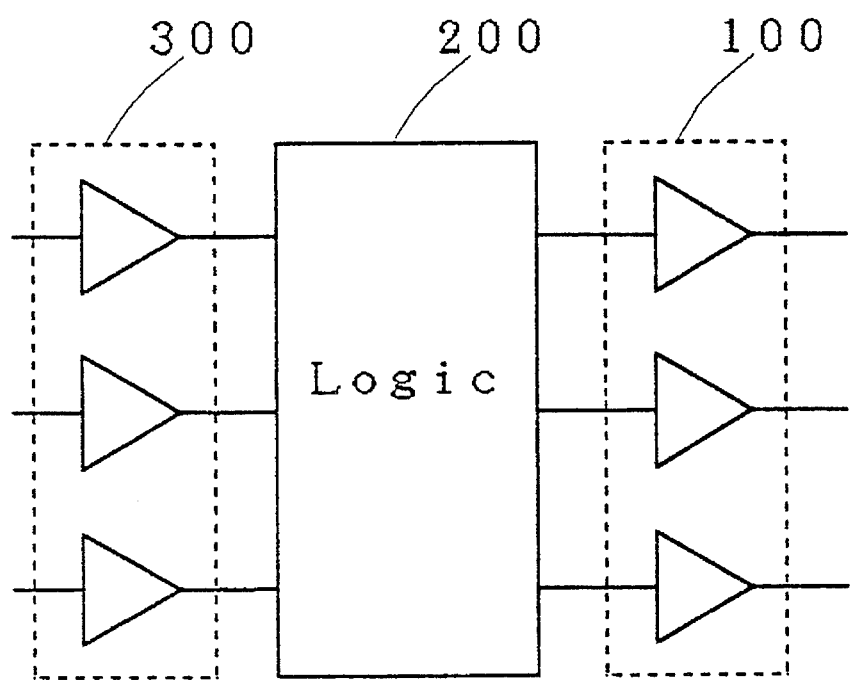
FIG. 19 is a block diagram showing a conventional technique.
Figure 20:
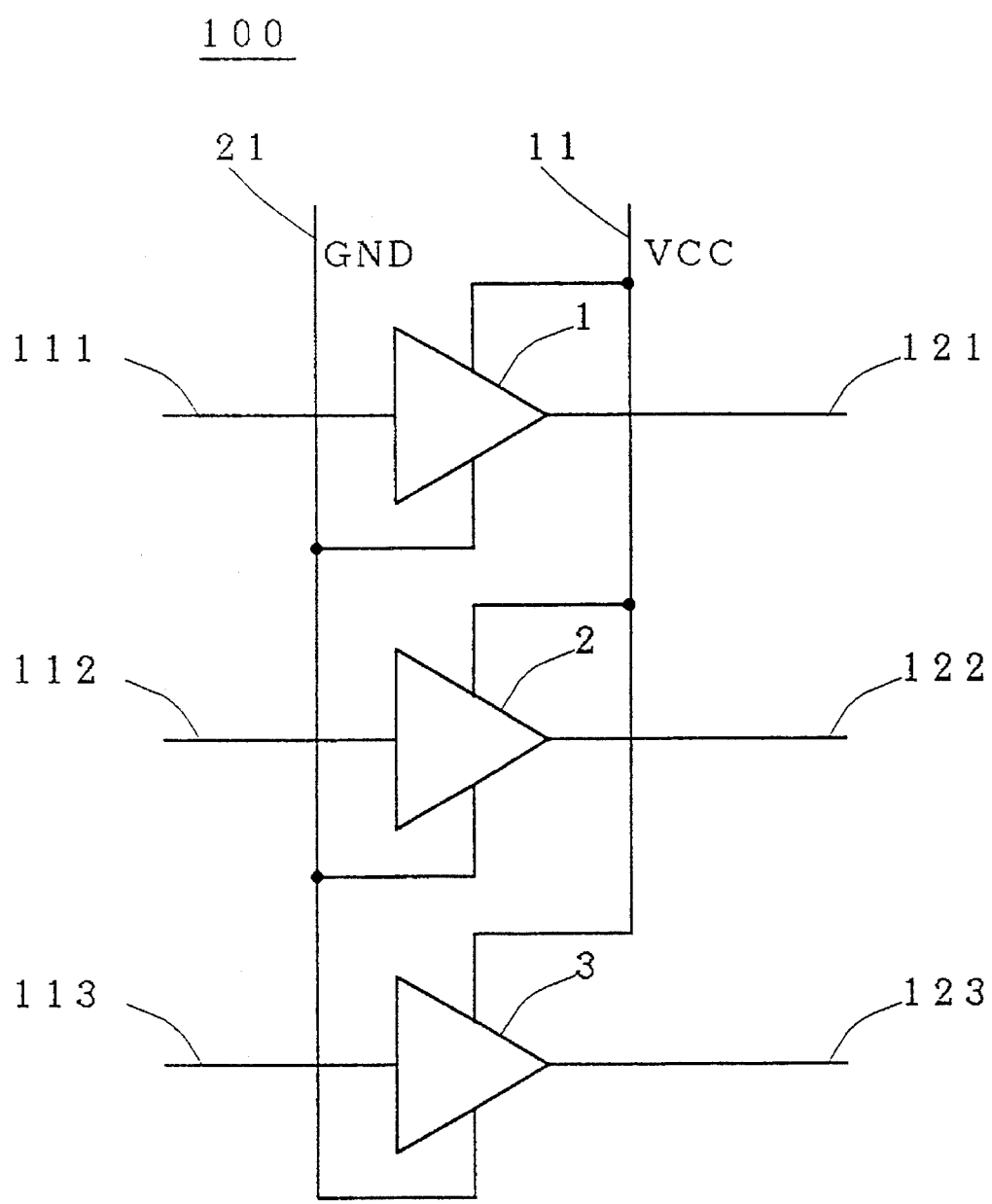
FIGS. 20 to 23 are circuitry diagrams showing the conventional technique.
Figure 21:
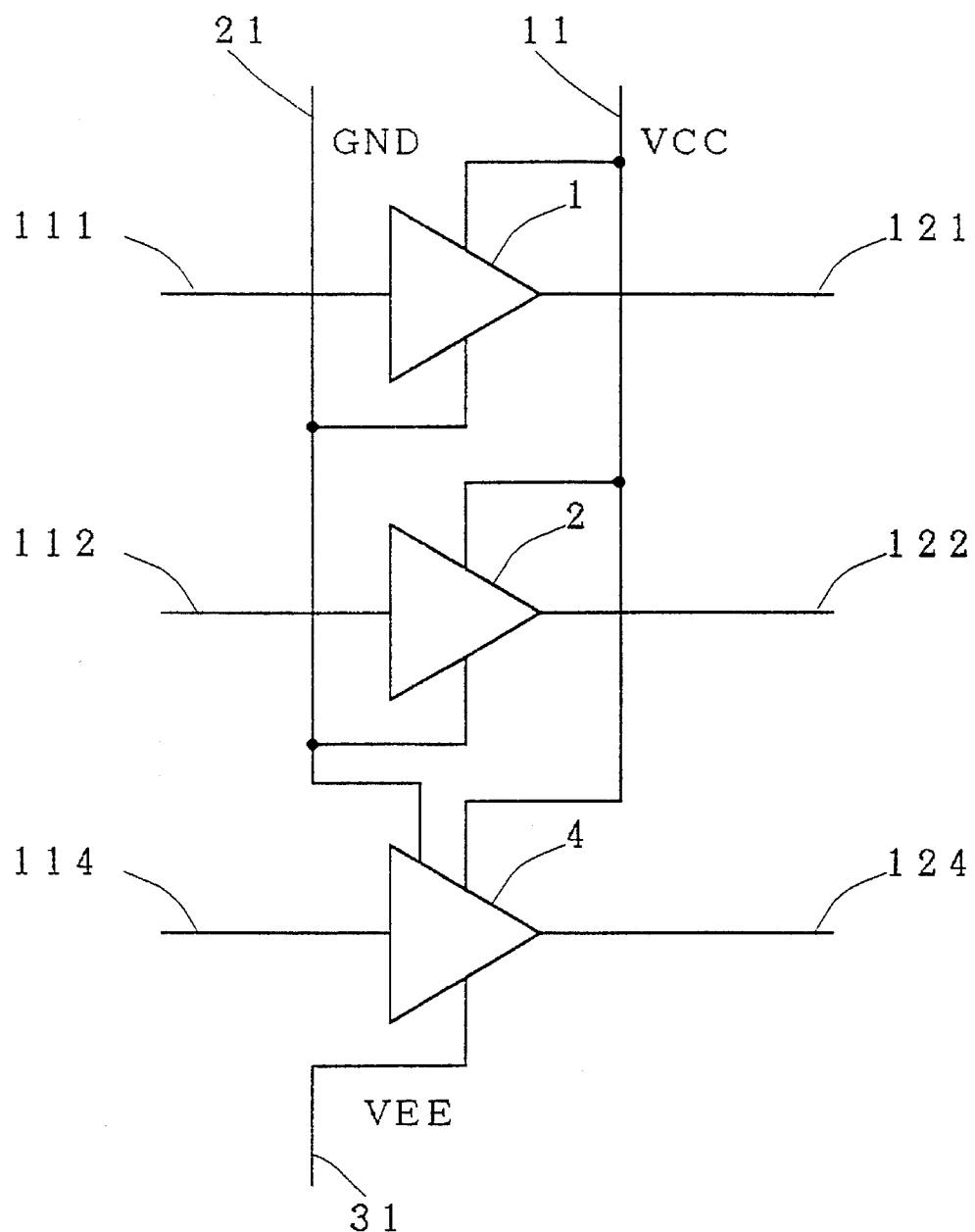

FIG. 16 is a circuitry diagram showing an example of an analog circuit 999 which can be formed using a cell such as that shown in FIG. 11. FIGS. 17 and 18 are plan views each showing connections made to the cell of FIG. 11 to form the analog circuit 999 of FIG. 16. FIGS. 17 and 18 are successive to each other at the imaginary line Q. In an area between the imaginary lines P and R, a plurality of cells which have the structure shown in FIG. 11 are arranged in the direction of these imaginary lines. A plurality of cells are disposed on both sides of the imaginary line P and on both sides of the imaginary line R as well.

The bipolar transistor 1100 of FIG. 11 corresponds to bipolar transistors 2117, 2111, 2114, 2113 and 2121 of FIGS. 17 and 18. The bipolar transistor 1120 corresponds to bipolar transistors 2110, 2112, 2116, 2115 and 2122. The resistor 1220 corresponds to resistors 2203, 2201, 2202, 2204 and 2205. In FIGS. 17 and 18, the thin solid lines represent wires which are formed in a first layer while the thin dotted lines represent wires which are formed in a second layer. The cross marks represent connections at which the bipolar transistors and the wires of the first layer are connected to each other. Encircled cross marks represent connections at which the wires of the first layer and the wires of the second layer are connected to each other.

By using a cell such described as above which is applicable to both a digital circuit and an analog circuit, even when a digital circuit and an analog circuit are to be used together, logic blocks can be formed within the inner region 1000 from the same cell. The effect of the fourth preferred embodiment is thus attained.

While the invention has been described in detail, the foregoing description is in all aspects illustrative and not restrictive. It is understood that numerous other modifications and variations can be devised without departing from the scope of the invention.

I claim:

1. A semiconductor integrated circuit device, comprising:
   (a) a plurality of semiconductor regions which are arranged in a semiconductor substrate;
   (b) a plurality of semiconductor integrated circuits which are formed in a first direction in rows in each of said semiconductor regions, said semiconductor integrated circuits receiving at least one common potential; and
   (c) at least one power source line which is disposed above said plurality of semiconductor integrated circuits, said power source line having an end at a boundary between adjacent two semiconductor regions of said semiconductor regions, said power source line extending in said first direction;
   wherein said plurality of semiconductor integrated circuits comprise a plurality of different types of logic blocks which output signals having different amplitudes and which are formed in a same row, said power source line is formed in said logic blocks, and said plurality of different types of logic blocks are formed by a plurality of cells.

2. The semiconductor integrated circuit device of claim 1, wherein said semiconductor integrated circuit includes:
   (b-1) a plurality of logic blocks for performing a predetermined process on information which is given to said semiconductor integrated circuit; and
   (b-2) an input/output circuit, including said plurality of different types of logic blocks, for inputting said information to said logic blocks and for outputting the processed information, wherein
   said power source line is formed in said input/output circuit.

3. The semiconductor integrated circuit device of claim 1, wherein said different types of logic blocks include an ECL type buffer and a TTL type buffer.

4. A semiconductor integrated circuit device comprising:
   (a) a plurality it of semiconductor regions which are arranged in a semiconductor substrate;
   (b) a plurality of semiconductor integrated circuits which are formed in a first direction in each of said semiconductor regions, said semiconductor integrated circuit receiving at least one common potential; and
   (c) at least one Dower source line which is disposed above said plurality of semiconductor integrated circuits, said power source line having an end at a boundary between two adjacent semiconductor regions, said power source line extending in said first direction, wherein said different types of logic blocks are formed by a plurality of cells, and said semiconductor integrated circuit includes:
   a first logic block for processing a digital signal; and
   a second logic block for processing an analog signal, wherein said power source line is formed in said first and second logic blocks.

5. A semiconductor integrated circuit device comprising:
   (a) a plurality of semiconductor regions which are arranged in a semiconductor substrate;
   (b) a plurality of semiconductor integrated circuits which are formed in a first direction in each of said semiconductor regions, said semiconductor integrated circuit receiving at least one common potential; and
   (c) at least one power source line which is disposed above said plurality of semiconductor integrated circuits, said power source line having an end at a boundary between two adjacent semiconductor regions, said power source line extending in said first direction, wherein said first and second logic blocks are formed by a plurality of cells, and said semiconductor integrated circuit includes:
   a first logic block of the TTL type; and
   a second logic block of the ECL type, wherein said power source line is formed in said first and said second logic blocks.

6. The semiconductor integrated circuit device of claim 1, wherein said semiconductor regions arc arranged in a second direction which is perpendicular to said first direction.

7. The semiconductor integrated circuit device of claim 4, wherein said semiconductor regions are arranged in a second direction which is perpendicular to said first direction.

8. The semiconductor integrated circuit device of claim 5, wherein said semiconductor regions are arranged in a second direction which is perpendicular to said first direction.

9. A semiconductor integrated circuit device, comprising:

(a) a plurality of semiconductor regions which are arranged in a semiconductor substrate;

(b) a plurality of semiconductor integrated circuits which are formed in a first direction in rows in each of said semiconductor regions, said semiconductor integrated circuits receiving at least one common potential; and (c) at least two power source lines, which are disposed above said plurality of semiconductor integrated circuits in a same row, said power source lines each having an end at a boundary between adjacent two semiconductor regions of said semiconductor regions, said power source lines extending in said first direction;

wherein said plurality of semiconductor integrated circuits comprise a plurality of different types of logic blocks with different logic levels and which output signals having different amplitudes and which are formed in a same row such that said at least two power source lines are connected to the different types of logic blocks within the same row, said power source lines are formed in said logic blocks, and said plurality of different types of logic blocks are formed by a plurality of cells.

10. The semiconductor integrated circuit device of claim 9, wherein said semiconductor integrated circuit includes:

(b-1) a plurality of logic blocks for performing a predetermined process on information which is given to said semiconductor integrated circuit; and (b-2) an input/output circuit for inputting said information to said logic blocks and for outputting the processed information, wherein said at least two power source lines are formed in said input/output circuit.

11. The semiconductor integrated circuit device of claim 9, wherein said different types of logic blocks include an ECL type buffer and a TTL type buffer.

* * * * *